United States Patent
Lee et al.

(10) Patent No.: US 12,010,866 B2
(45) Date of Patent: Jun. 11, 2024

(54) DISPLAY PANEL, INCLUDING RECESS PATTERN IN HOLE AREA, ELECTRONIC APPARATUS INCLUDING THE SAME, AND METHOD FOR MANUFACTURING DISPLAY PANEL

(71) Applicant: Samsung Display Co., Ltd., Yongin-si (KR)

(72) Inventors: Hyoungsub Lee, Yongin-Si (KR); Junghan Seo, Hwaseong-Si (KR); Woo Yong Sung, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 534 days.

(21) Appl. No.: 17/256,826

(22) PCT Filed: Apr. 15, 2019

(86) PCT No.: PCT/KR2019/004533
§ 371 (c)(1),
(2) Date: Dec. 29, 2020

(87) PCT Pub. No.: WO2020/004789
PCT Pub. Date: Jan. 2, 2020

(65) Prior Publication Data
US 2021/0151715 A1    May 20, 2021

(30) Foreign Application Priority Data

Jun. 29, 2018 (KR) .......................... 10-2018-0075944

(51) Int. Cl.
*H10K 50/844* (2023.01)
*H10K 59/12* (2023.01)
(Continued)

(52) U.S. Cl.
CPC ......... *H10K 50/844* (2023.02); *H10K 59/122* (2023.02); *H10K 59/124* (2023.02);
(Continued)

(58) Field of Classification Search
CPC .... H10K 50/844; H10K 77/10; H10K 59/122; H10K 59/124; H10K 59/1201; H10K 71/00
(Continued)

(56) References Cited

U.S. PATENT DOCUMENTS 9,395,569 B2   7/2016   Kim et al.
9,905,629 B2   2/2018   Kim et al.
(Continued)

FOREIGN PATENT DOCUMENTS

CN   105870146 A   8/2016
CN   106887523 A   6/2017
(Continued)

OTHER PUBLICATIONS

International Search Report dated Jul. 19, 2019 for PCT/KR2019/004533.

*Primary Examiner* — Eric W Jones
(74) *Attorney, Agent, or Firm* — CANTOR COLBURN LLP

(57) ABSTRACT

A display panel includes a base substrate, in which a hole area, an active area surrounding the hole area, and a peripheral area adjacent to the active area are defined, a circuit layer including a first circuit insulating layer on the base substrate, a second circuit insulating layer on the first circuit insulating layer, and a thin film transistor on the active area, a display layer including a first display insulating layer on the circuit layer, a second display insulating layer on the first display insulating layer, and a light emitting element on the active area and connected to the thin film transistor, a guide (Continued)

pattern on the circuit layer between the light emitting element and the groove part, and an encapsulation layer which covers the light emitting element and including first and second inorganic layers and an organic layer. The organic layer covers at least a portion of the guide pattern.

26 Claims, 36 Drawing Sheets

(51) Int. Cl.
H10K 59/122 (2023.01)
H10K 59/124 (2023.01)
H10K 71/00 (2023.01)
H10K 77/10 (2023.01)

(52) U.S. Cl.
CPC ............ *H10K 71/00* (2023.02); *H10K 77/10* (2023.02); *H10K 59/1201* (2023.02)

(58) Field of Classification Search
USPC ....................................................... 257/40, 59
See application file for complete search history.

(56) References Cited

U.S. PATENT DOCUMENTS

| | | | |
|---|---|---|---|
| 9,947,898 B2 | 4/2018 | Kim et al. | |
| 10,135,010 B2 | 11/2018 | Kim et al. | |
| 10,193,102 B2 | 1/2019 | Kanaya | |
| 10,797,266 B2 | 10/2020 | Choi et al. | |
| 10,872,932 B2 | 12/2020 | Shi et al. | |
| 2007/0194696 A1* | 8/2007 | Hsu | H10K 59/122 313/504 |
| 2008/0164810 A1* | 7/2008 | Oda | H10K 59/124 445/24 |
| 2012/0181525 A1* | 7/2012 | Sugimoto | H10K 59/122 257/40 |
| 2016/0233289 A1* | 8/2016 | Son | H10K 50/80 |
| 2016/0284774 A1* | 9/2016 | Zhang | H10K 50/822 |
| 2017/0125738 A1* | 5/2017 | Kim | H10K 50/822 |
| 2017/0288004 A1 | 10/2017 | Kim et al. | |
| 2018/0026152 A1 | 1/2018 | Benson et al. | |
| 2018/0151834 A1* | 5/2018 | Kanaya | H10K 59/121 |
| 2019/0355930 A1 | 11/2019 | Lee et al. | |
| 2020/0258957 A1 | 8/2020 | Kwak et al. | |

FOREIGN PATENT DOCUMENTS

| | | |
|---|---|---|
| CN | 107275363 A | 10/2017 |
| CN | 107579171 A | 1/2018 |
| JP | 201887863 A | 6/2018 |
| KR | 101257939 B1 | 4/2013 |
| KR | 1020170045459 A | 4/2017 |
| KR | 1020170059864 A | 5/2017 |
| KR | 1020170111827 A | 10/2017 |
| KR | 1020170115177 A | 10/2017 |
| KR | 101800669 B1 | 12/2017 |
| KR | 1020170142232 A | 12/2017 |
| KR | 1020180054386 A | 5/2018 |
| KR | 1020180062155 A | 6/2018 |
| KR | 1020190132602 A | 11/2019 |

* cited by examiner

DISPLAY PANEL, INCLUDING RECESS PATTERN IN HOLE AREA, ELECTRONIC APPARATUS INCLUDING THE SAME, AND METHOD FOR MANUFACTURING DISPLAY PANEL

TECHNICAL FIELD

Embodiments of the invention relates to a display panel and a method for manufacturing the same, and more particularly, to a display panel having improved reliability and a method for manufacturing the same.

BACKGROUND ART

An organic light emitting display panel includes an organic light emitting element. The organic light emitting element may be vulnerable to moisture or oxygen and thus may be easily damaged. Thus, in the organic light emitting display panel, as the moisture or oxygen introduced from the outside are stably blocked, the organic light emitting display device may be improved in reliability and lifetime.

DISCLOSURE OF THE INVENTION

Technical Problem

Therefore, an object of the invention is to provide a display panel having improved process reliability and a method for manufacturing the same.

Technical Solution

A display panel according to an embodiment of the invention includes: a base substrate including a front surface and a rear surface, where a hole area, an active area surrounding the hole area, and a peripheral area adjacent to the active area are defined in the base substrate, and a through-hole defined through the base substrate from the front surface to the rear surface and a groove part surrounding the through-hole and recessed from the front surface are defined in the hole area; a circuit layer including a first circuit insulating layer disposed on the base substrate, a second circuit insulating layer disposed on the first circuit insulating layer, and a thin film transistor disposed on the active area; a display layer including a first display insulating layer disposed on the circuit layer, a second display insulating layer disposed on the first display insulating layer, and a light emitting element disposed on the active area and connected to the thin film transistor; a guide pattern disposed on the circuit layer and disposed between the light emitting element and the groove part; and an encapsulation layer which covers the light emitting element, where the encapsulation layer includes a first inorganic layer disposed on the active area and the hole area, a second inorganic layer disposed on the first inorganic layer, and an organic layer disposed between the first inorganic layer and the second inorganic layer, and the organic layer covers at least a portion of the guide pattern.

In an embodiment, the guide pattern may be a recess pattern defined in the first display insulating layer or the second display insulating layer.

In an embodiment, the guide pattern may pass through the second display insulating layer and be recessed from a top surface of the first display insulating layer on a cross-section.

In an embodiment, the guide pattern may be defined in the second display insulating layer and spaced apart from the first display insulating layer.

In an embodiment, the guide pattern may include: a first guide pattern defined in the second display insulating layer and recessed from a top surface of the second display insulating layer; and a second guide pattern defined in the first display insulating layer and recessed from a top surface of the first display insulating layer, wherein the first guide pattern and the second guide pattern may be spaced apart from each other when viewed on a plane.

In an embodiment, the guide pattern may be a pattern disposed on the second circuit insulating layer and spaced apart from the first display insulating layer or the second display insulating layer when viewed on a plane.

In an embodiment, the guide pattern may include the same material as the first display insulating layer or the second display insulating layer.

In an embodiment, the guide pattern may include a plurality of island patterns spaced apart from each other when viewed on a plane.

In an embodiment, the island patterns may be radially aligned from a center of the through-hole.

In an embodiment, the island patterns may be randomly arranged.

In an embodiment, the guide pattern may have a closed line shape surrounding the groove part when viewed on a plane.

In an embodiment, the closed line shape may include at least one selected from a circle, an ellipse, and a polygonal shape.

In an embodiment, the groove part may have an under-cut shape on a cross-section.

In an embodiment, the groove part may include: a first groove part adjacent to the through-hole; and a second groove part disposed between the first groove part and the guide pattern to surround the first groove part, wherein each of an inner surface of the first groove part and an inner surface of the second groove part may be covered by the first inorganic layer.

In an embodiment, when viewed on a plane, the organic layer may overlap the second groove part and be spaced apart from the first groove part.

In an embodiment, the display panel may further include a filling pattern disposed at the first groove part and spaced apart from the organic layer to be sealed by the first inorganic layer and the second inorganic layer, where the filling pattern may include a same material as the organic layer.

In an embodiment, when viewed on a plane, the organic layer may overlap the first groove part and the second groove part.

In an embodiment, the display panel may further include a dam part disposed between the groove part and the through-hole to surround the groove part, wherein the first inorganic layer may cover the dam part.

An electronic apparatus according to an embodiment of the invention includes: a display panel in which a through-hole and a groove pattern adjacent to the through-hole are defined, where the groove pattern defines a predetermined recessed space; and an electronic module configured to overlap the through-hole when viewed on a plane, wherein the display panel includes: a base substrate; a circuit layer including a first circuit insulating layer disposed on the base substrate, a second circuit insulating layer disposed on the first circuit insulating layer, and a thin film transistor disposed on an active area; a display layer including a first display insulating layer disposed on the circuit layer, a second display insulating layer disposed on the first display insulating layer, and a light emitting element disposed on the active area and connected to the thin film transistor; a recess pattern disposed between the groove pattern and the active area and defined in the first display insulating layer or the second display insulating layer; and an encapsulation layer which covers the light emitting element and includes a first inorganic layer disposed on the active area and the recess pattern, a second inorganic layer disposed on the first inorganic layer, and an organic layer disposed between the first inorganic layer and the second inorganic layer, where at least a portion of the recess pattern is filled with the organic layer.

In an embodiment, the recess pattern may be recessed from a top surface of the second display insulating layer.

In an embodiment, the recess pattern may pass through the second display insulating layer and extend up to the first display insulating layer.

In an embodiment, the recess pattern may be recessed from a top surface of the first display insulating layer and spaced apart from the second display insulating layer when viewed on the plane.

In an embodiment, the recess pattern may be provided in plurality, each of which has an island shape, and the plurality of recess patterns may be radially arranged from a center of the through-hole.

In an embodiment, the recess pattern may be provided in plurality, each of which has an island shape, and the plurality of recess patterns may be randomly arranged.

In an embodiment, the display panel may further include a dam part disposed adjacent to the through-hole, the groove pattern may include a first groove pattern disposed between the through-hole and the dam part and a second groove pattern disposed between the dam part and the recess pattern to surround the first groove pattern, and the second groove pattern may be filled with the organic layer.

In an embodiment, the recess pattern may have a closed line shape which surrounds the through-hole.

A method for manufacturing a display panel according to an embodiment of the invention includes: providing a circuit layer including a first circuit insulating layer, a second circuit insulating layer, and a thin film transistor on a base substrate, where the base substrate is divided into a hole area and an active area surrounding the hole area, when viewed on a plane; providing a first display insulating layer and a second display insulating layer on the circuit layer; forming a groove part in the base substrate; and patterning the first display insulating layer or the second display insulating layer to form a guide pattern.

In an embodiment, the guide pattern and the groove part may be formed during a same process.

In an embodiment, the method may further include preparing a mask with a first open part exposing a portion of the hole area of the base substrate and a second open part exposing a portion of the hole area of the second display insulating layer, where the groove part may be formed by removing a portion of an area exposed through the first open part and by removing a portion of an area exposed through the second open part.

In an embodiment, the providing the first display insulating layer and the second display insulating layer on the circuit layer may include providing the second display insulating layer on the first display insulating layer after providing the first display insulating layer on the circuit layer, the providing the second display insulating layer may include: providing a first electrode connected to the thin film transistor on the first display insulating layer; providing a preliminary insulating layer covering the first electrode; and forming an opening exposing at least a portion of the first electrode through the preliminary insulating layer, and the guide pattern and the opening may be formed during a same process.

Advantageous Effects

According to embodiments of the invention, the organic layer pattern of the encapsulation layer is formed, such that the spreading of the organic layer may be controlled. Therefore, the area on which the organic layer pattern is formed may be easily controlled to simplify the process.

In addition, according to the invention, since the guide pattern is formed in the existing process without adding the separate process, the process time may be reduced, and the process cost may be reduced.

MODE FOR CARRYING OUT THE INVENTION

Figure 1:
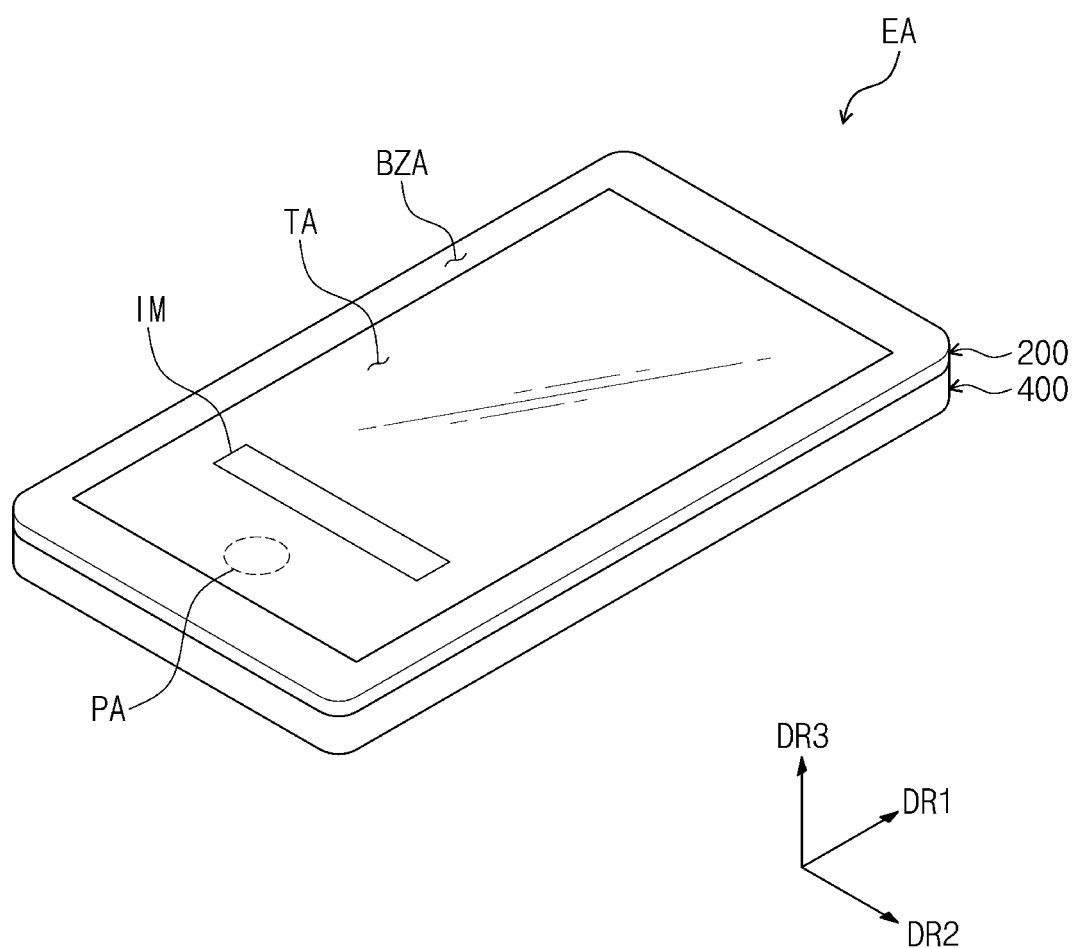
FIG. 1 is a perspective view of an electronic apparatus according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2A:
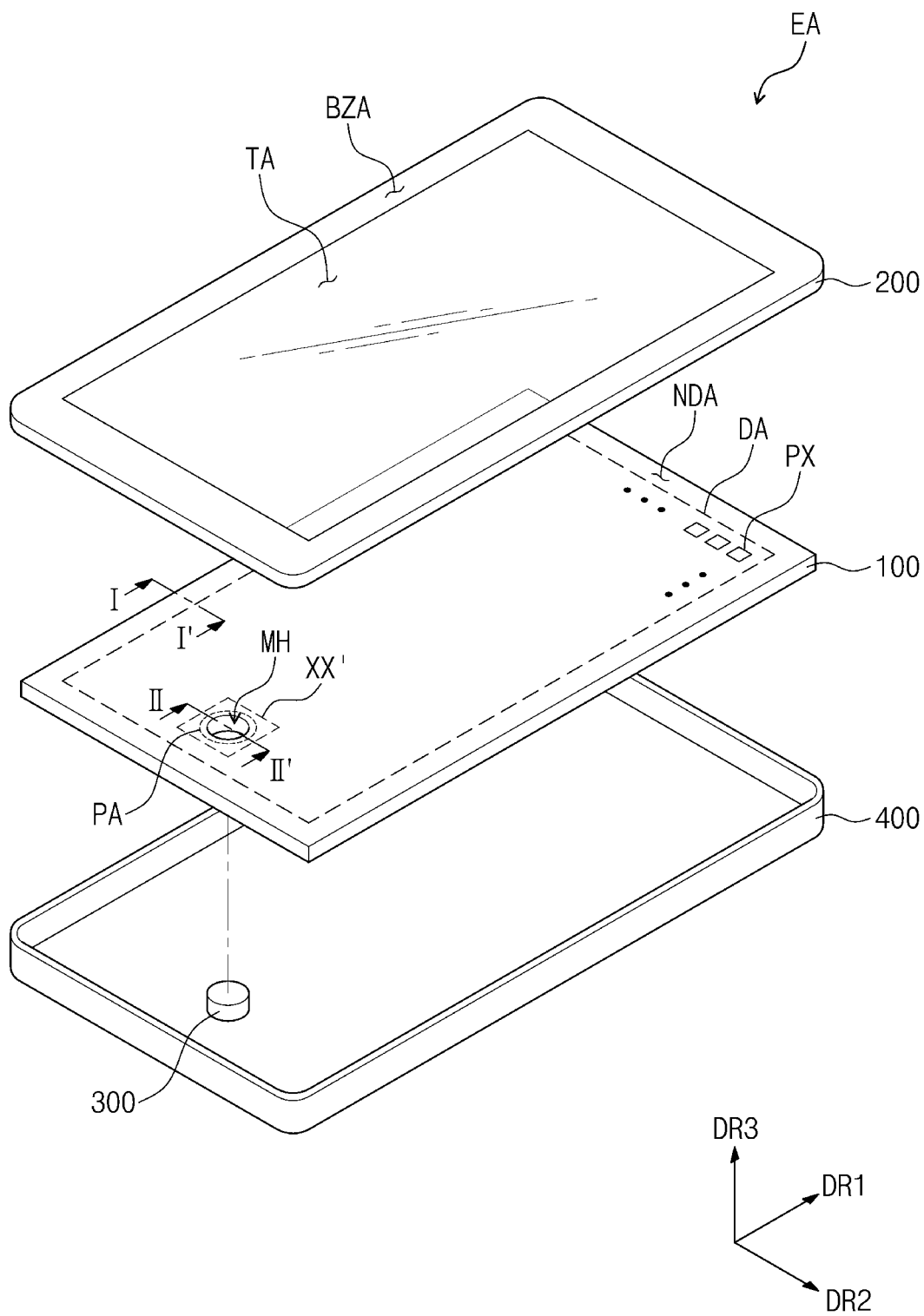
FIG. 2A is an exploded perspective view of the electronic apparatus of FIG. 1.
Figure 2B:
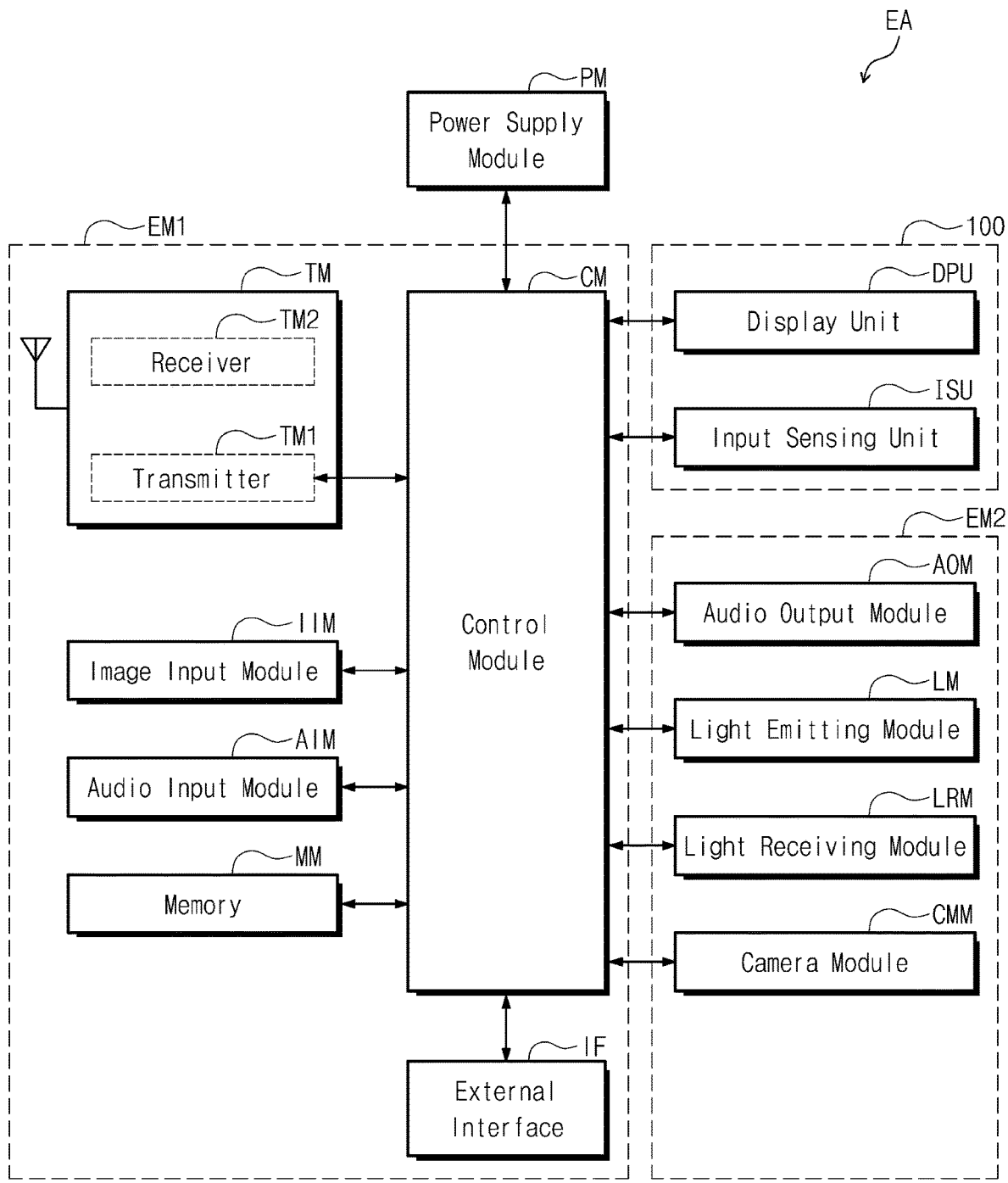
FIG. 2B is a block diagram of the electronic apparatus of FIG. 1.

FIG. 1 is a perspective view of an electronic apparatus according to an embodiment of the invention. FIG. 2A is an exploded perspective view of the electronic apparatus of FIG. 1. FIG. 2B is a block diagram of the electronic apparatus of FIG. 1. Hereinafter, an electronic apparatus according to an embodiment of the invention will be described with reference to FIGS. 1 to 2B.

An electronic apparatus EA may be an apparatus that is activated according to an electrical signal. The electronic apparatus EA may include various types of electronic apparatus. In an embodiment, the electronic apparatus EA may include a tablet, a notebook, a computer, or a smart television, for example. Hereinafter, for convenience of description, embodiments where the electronic apparatus EA is a smart phone will be described in detail.

As illustrated in FIG. 1, an embodiment of the electronic apparatus EA may include a display surface that displays an image IM and is defined on a front surface thereof. The display surface may be defined in parallel to a surface defined by a first direction DR1 and a second direction DR2. The display surface may include a transmission area TA and a bezel area BZA adjacent to the transmission area TA.

The image IM is displayed on the transmission area TA of the electronic apparatus EA. FIG. 1A illustrates an Internet search window as an example of the image IM. The transmission area TA may have a rectangular shape that is parallel to the first direction DR1 and the second direction DR2. However, this is merely an example. Alternatively, the electronic apparatus EA may have various shapes and is not limited to any one embodiment.

The bezel area BZA is adjacent to the transmission area TA. The bezel area BZA may surround the transmission area TA. However, this is merely an example. Alternatively, the bezel area BZA may be disposed adjacent to only one side of the transmission area TA or be omitted. The electronic apparatus according to an embodiment of the invention may be variously modified, but is not limited to any one embodiment.

A normal direction of the display surface (i.e., a plane defined by the first and second directions DR1 and DR2) may correspond to a thickness direction (hereinafter, referred to as a third direction) of the electronic apparatus EA. In embodiments, a front surface (or a top surface) or a rear surface (or a bottom surface) of each of the members may be defined with respect to a direction in which the image IM is displayed. The front and rear surfaces may face each other in a third direction DR3.

The directions indicated as the first to third direction DR1, DR2, and DR3 may be a relative concept and thus changed into different directions. Hereinafter, the first to third directions may be directions indicated by the first to third directions DR1, DR2, and DR3 and designated by the same reference numerals, respectively.

As illustrated in FIG. 2A, an embodiment of the electronic apparatus EA includes an electronic panel 100, a window member 200, an electronic module 300, and an accommodation member 400. As illustrated in FIG. 2B, an embodiment of the electronic apparatus EA may further include an electronic panel 100, a first electronic module EM1, a second electronic module EM2, and a power supply module PM. In FIG. 2A, portions of the constituents of the FIG. 2B are omitted. Hereinafter, an embodiment of the electronic apparatus EA will be described with reference to FIGS. 2A and 2B.

The electronic panel 100 may display the image IM or sense an input applied from the outside. In one embodiment, for example, the electronic panel 100 may include a display unit DPU for displaying the image IM and an input sensing unit ISU for sensing the external input.

The input sensing unit ISU senses an input applied from the outside. The external input includes various types of external inputs such as a portion of user's body, light, heat, a pressure, or the like. The external input may be an input applied to the window member 200.

The display unit DPU and the input sensing unit ISU may be provided independently and may be physically bonded to each other through a predetermined adhesive member. Alternatively, the display unit DPU and the input sensing unit ISU may be sequentially laminated on a single base substrate.

In an alternative embodiment of the electronic panel 100, the input sensing unit ISU may be omitted. An embodiment in which the electronic panel 100 (hereinafter, referred to as a display panel) includes the display unit DPU, and the input sensing unit ISU is omitted will be exemplarily described.

Referring to FIG. 2A, the display panel 100 may include an active area DA, a peripheral area NDA, and a hole area PA, which are divided or defined on a plane. Herein, the phrase "on a plane" means "when viewed in a direction normal to a plane of a display surface or a plane defined by the first and second direction DR1 and DR2. The active area DA may be an area on which the image IM is displayed. The display panel 100 includes a pixel PX disposed on the active area DA. The pixel PX may be provided in plurality and arranged on the active area DA. Light generated by the pixel PX implements the image IM.

The peripheral area NDA may be an area covered by the bezel area BZA. The peripheral area NDA is adjacent to the active area DA. The peripheral area NDA may surround the active area DA. A driving circuit or a driving line for driving the active area DA may be disposed on the peripheral area NDA.

Although not shown, a portion of the peripheral area NDA of the display panel 100 may be curved. Thus, one portion of the peripheral area NDA may face the front surface of the electronic apparatus EA, and the other portion of the peripheral area NDA may face the rear surface of the electronic apparatus EA. In an alternative embodiment of the display panel 100, the peripheral area NDA may be omitted.

The hole area PA may be an area in which a module hole MH is defined. The display panel 100 according to an embodiment of the invention may include at least one module hole MH.

An edge of the hole area PA may be surrounded by the active area DA. The hole area PA may be spaced apart from the peripheral area NDA with the active area DA therebetween on the plane. The module hole MH may be defined in the hole area PA. Thus, the module hole MH may be surrounded by the active area DA, on which the image is displayed, on the plane.

The module hole MH is defined through the display panel 100. The module hole MH may be a through-hole connected from a front surface to a rear surface of the display panel 100. The module hole MH may have a cylindrical shape having a height in the third direction DR3. The module hole MH overlaps the electronic module 300 on the plane. The electronic module 300 may be accommodated in the module hole MH or may have a size similar to that of the module hole MH. A constituent disposed on the rear surface of the display panel 100 to overlap the module hole MH may be visible through the module hole MH at the front surface of the display panel 100. The electronic module 300 may receive an external input through the module hole MH. The electronic module 300 will be described below in more detail.

The window member 200 is disposed on the front surface of the electronic apparatus EA. The window member 200 may be disposed on the front surface of the display panel 100 to protect the display panel 100. In one embodiment, for example, the window member 200 may include a glass substrate, a sapphire substrate, or a plastic film. The window member 200 may have a single layer or multilayered structure. In one embodiment, for example, the window member 200 may have a laminated structure of a plurality of plastic films bonded to each other by using an adhesive or a laminated structure of a glass substrate and a plastic film, which are bonded to each other by using an adhesive.

The window member 200 may be divided into a transmission area TA and a bezel area BZA. The transmission area TA may be an area through which incident light is transmitted. The transmission area TA may have a shape corresponding to that of the active area DA. In one embodiment, for example, the transmission area TA overlaps an entire surface or at least a portion of the active area DA. The image IM displayed on the active area DA of the display panel 100 may be visible through the transmission area TA from the outside.

The bezel area BZA may be an area HA having light transmittance that is to relatively less than that of the transmission area TA. The bezel area BZA defines a shape of the transmission area TA. The bezel area BZA may be disposed adjacent to the transmission area TA to surround the transmission area TA.

The bezel area BZA may have a predetermined color. The bezel area BZA may cover the peripheral area NDA of the display panel 100 to prevent the peripheral area NDA from being visible from the outside. However, this is merely an example. In an alternative embodiment of the window member 200, the bezel area BZA may be omitted.

The accommodation member 400 may be coupled to the window member 200. The accommodation member 400 may be provided on the rear surface of the electronic apparatus EA. The accommodation member 400 may be coupled to the window member 200 to define an inner space.

The accommodation member 400 may include a material having relatively high rigidity. In one embodiment, for example, the accommodation member 400 may include a plurality of frames and/or plates, which are made of glass, plastic, and metal. The accommodation member 400 may stably protect the constituents of the electronic apparatus, which are accommodated in the inner space, against an external impact. The display panel 100 and various constituents of FIG. 2B may be accommodated in the inner space provided by the accommodation member 400.

Referring to FIG. 2B, the electronic apparatus EA may include a power supply module PM, a first electronic module EM1, and a second electronic module EM2. The power supply module PM supplies power used for an overall operation of the electronic apparatus EA. The power supply module PM may include a general battery module.

The first electronic module EM1 and the second electronic module EM2 may include various functional modules for driving the electronic apparatus EA. The first electronic module EM1 may be directly mounted on a mother board electrically connected to the display panel 100 or may be mounted on a separate board and electrically connected to the mother board through a connector (not shown).

The first electronic module EM1 may include a control module CM, a wireless communication module TM, an image input module IIM, an audio input module AIM, a memory MM, and an external interface IF. A portion of the modules may not be mounted on the mother board but electrically connected to the mother board through a flexible circuit board.

The control module CM controls the overall operation of the electronic apparatus EA. The control module CM may be a micro processor. In one embodiment, for example, the control module CM may activate or inactivate the display panel 100. The control module CM may control other modules such as the image input module IIM or the audio input module AIM on the basis of a touch signal received from the display panel 100.

The wireless communication module TM may transmit/receive a wireless signal to/from the other terminal by using Bluetooth or Wi-Fi line. The wireless communication module TM may transmit/receive an audio signal by using a general communication line. The wireless communication module TM includes a transmitter TM1 for modulating and transmitting a signal to be transmitted and a receiver TM2 for demodulating the received signal.

The image input module IIM processes the image signal to convert the processed image signal into image data that is capable of being displayed on the display panel 100. The audio input module AIM receives external audio signals by using a microphone during recording mode or a voice recognition mode to convert the received audio signal into electrical sound data.

The external interface IF serves as an interface connected to an external charger, a wired/wireless data port, and a card socket (for example, a memory card and an SIM/UIM card).

The second electronic module EM2 may include an audio output module AOM, a light emitting module LM, a light receiving module LRM, and a camera module CMM. The above-described constituents of the second electronic module EM2 may be directly mounted on the mother board, may be mounted on a separate board and electrically connected to the display panel 100 through a connector (not shown), or may be electrically connected to the first electronic module EM1.

The audio output module AOM converts audio data received from the wireless communication module TM or audio data stored in the memory MM to output the converted audio data to the outside.

The light emitting module LM generates and outputs light. The light emitting module LM may output infrared rays. The light emitting module LM may include a light emitting diode. The light receiving module LRM may sense the infrared rays. The light receiving module LRM may be activated when infrared rays having a predetermined level or more is sensed. The light receiving module LRM may include a CMOS sensor. The infrared rays generated in the light emitting module LM may be outputted and then be reflected by an external object (for example, a user's finger or face), and the reflected infrared rays may be incident into the light receiving module LRM. The camera module CMM photographs an external image.

The electronic module 300 of FIG. 2A may receive the external input transmitted through the module hole MH or provide an output through the module hole MH. The electronic module 300 may be one of the modules constituting the first electronic module EM1 and the second electronic module EM2. In one embodiment, for example, the electronic module 300 may be a camera, a speaker, or a sensor that senses light or heat. The electronic module 300 may sense an external object received through the module hole MH or provide a sound signal such as voice to the outside through the module hole MH. Here, the remaining constituents of the first electronic module EM1 and the second electronic module EM2 may be disposed at different positions and thus may not be illustrated. However, this is merely an example. The electronic module 300 may include a plurality of modules among modules constituting the first electronic module EM1 and the second electronic module EM2, but is not limited to any one embodiment. Although not shown, the electronic apparatus EA according to an embodiment of the invention may further include a transparent member disposed between the electronic module 300 and the display panel 100. The transparent member may be an optically transparent film so that the external input transmitted through the module hole MH passes through the transparent member and is transmitted to the electronic module 300. The transparent member may be attached to the rear surface of the display panel 100 or be disposed between the display panel 100 and the electronic module 300 without an adhesive layer. The electronic apparatus EA according to an embodiment of the invention may have various shapes, but is not limited to any one embodiment.

In an embodiment of the invention, the display panel 100 may include the module hole MH. Thus, a separate space provided from the electronic module 300 outside the peripheral area NDA may be omitted. Also, the module hole MH may be defined in the hole area PA surrounded by the active area DA so that the electronic module 300 is disposed to overlap the transmission area TA, but not the bezel area BZA. Thus, the bezel area BZA may be reduced in area to realize an electronic apparatus EA having a narrow bezel. Also, when the electronic module 300 is accommodated in the module hole MH, a compact electronic apparatus EA may be realized.

Figure 3A:
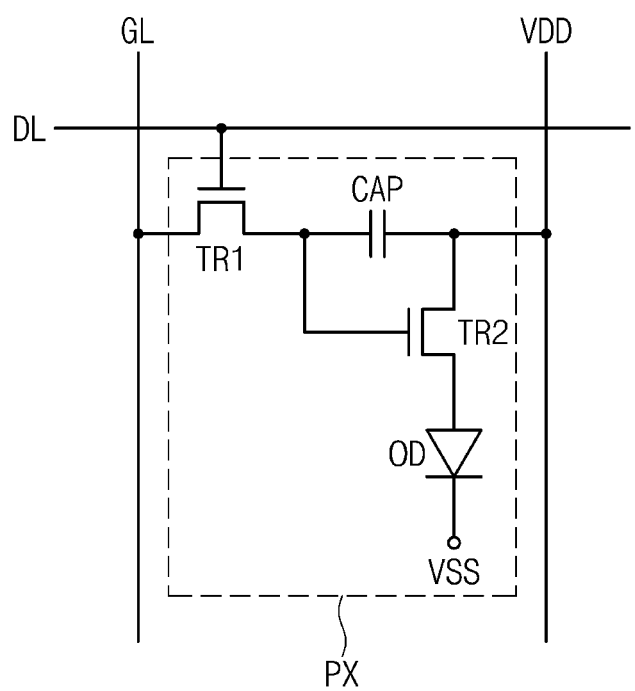
FIG. 3A is a schematic equivalent circuit diagram illustrating a portion of constituents of FIG. 3.
Figure 3B:
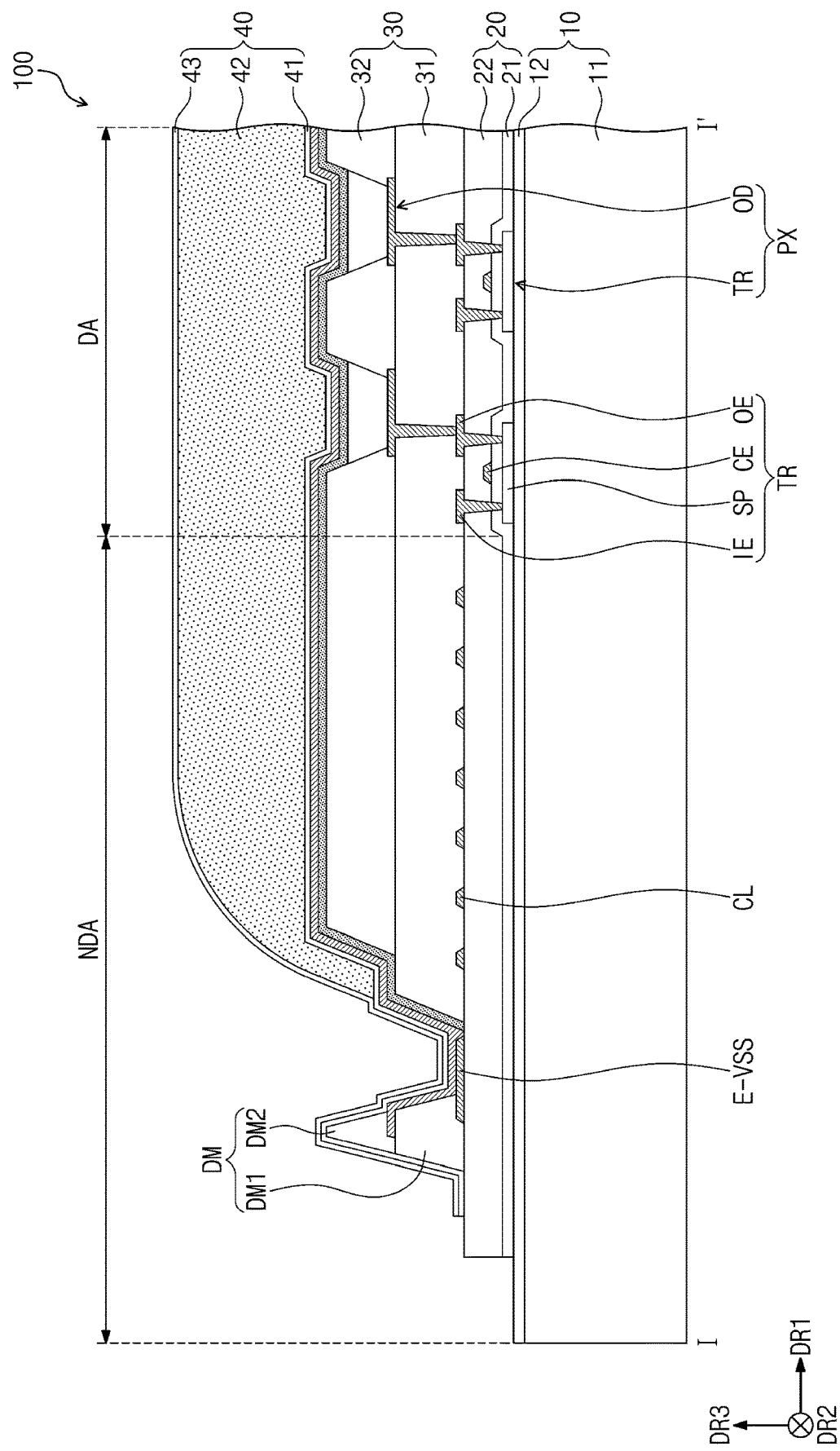
FIG. 3B is a cross-sectional view taken along line I-I' of FIG. 2A.

FIG. 3A is a schematic equivalent circuit view illustrating a portion of constituents of FIG. 3. FIG. 3B is a cross-sectional view taken along line I-I' of FIG. 2A. In FIG. 3A, an equivalent circuit diagram of one pixel PX is schematically illustrated for easy description. Hereinafter, an embodiment of the invention will be described with reference to FIGS. 3A and 3B.

The display panel 100 may include an insulating substrate 10, a pixel PX, a plurality of lines CL, a power connection pattern E-VSS, a peripheral dam part DM, and a plurality of insulating layers 20, 30, and 40. The insulating layers 20, 30, and 40 may include a circuit insulating layer 20, a display insulating layer 30, and an encapsulation layer 40.

The insulating substrate 10 may include a base layer 11 and an auxiliary layer 12. The base layer 11 includes an insulating material. The base layer 11 may include a flexible material. In one embodiment, for example, the base layer 11 may include polyimide ("PI"). However, this is merely an example. In one alternative embodiment, for example, the base layer 11 may include a rigid material or may be made of various materials such as glass and plastic, but is not limited to any one embodiment.

The auxiliary layer 12 is disposed on the base layer 11. The auxiliary layer 12 may entirely cover the base layer 11 or cover an entire upper surface of the base layer 11.

The auxiliary layer 12 may include a barrier layer and/or a buffer layer. Accordingly, the auxiliary layer 12 may reduce surface energy of the insulating substrate 10 to prevent oxygen or moisture introduced through the base layer 11 from being permeated into the pixel PX or to stably form the pixel PX on the insulating substrate 10.

In the insulating substrate 10, at least one of the base layer 11 or the auxiliary layer 12 may be provided in plurality and be alternately laminated. Alternatively, at least one of the barrier layer or the buffer layer constituting the auxiliary layer 12 may be provided in plurality or may be omitted. However, this is merely an example. The insulating substrate 10 according to an embodiment of the present invention may be variously modified, but is not limited to any one embodiment.

The pixel PX may be disposed on the insulating substrate 10. As described above, the pixel PX may be disposed on the active area DA of the insulating substrate 10. Referring to FIG. 3A, an embodiment of the pixel PX may be connected to a plurality of signal lines. In such an embodiment, a gate line GL, a data line DL, and a power line VDD of the signal lines are illustrated as an example. However, this is merely an example. In one alternative embodiment, for example, the pixel PX may be additionally connected to various signal lines, but is not limited to any one embodiment.

The pixel PX may include a first thin film transistor TR1, a capacitor CAP, a second thin film transistor TR2, and a light emitting element OD. The first thin film transistor TR1 may be a switching element that controls turn-on/off of the pixel PX. The first thin film transistor TR1 may transmit or block the data signal transmitted through the data line DL in response to the gate signal transmitted through the gate line GL.

The capacitor CAP is connected to the first thin film transistor TR1 and the power line VDD. The capacitor CAP charges electrical charges by an amount corresponding to a difference between the data signal received from the first thin film transistor TR1 and a first power voltage applied to the power line VDD.

The second thin film transistor TR2 is connected to the first thin film transistor TR1, the capacitor CAP, and the light emitting element OD. The second thin film transistor TR2 controls driving current flowing through the light emitting element OD to correspond to an amount of charges stored in the capacitor CAP. A turn-on time of the second thin film transistor TFT2 may be determined based on the amount of charges charged in the capacitor CAP. The second thin film transistor TR2 provides the first power voltage transmitted through the power line VDD during the turn-on time to the light emitting element OD. The light emitting element OD connects the second thin film transistor TR2 to the power terminal VSS. The light emitting element OD emits light as a voltage corresponding to a difference between the signal transmitted through the second thin film transistor TR2 and the second power voltage received through the power terminal VSS. The light emitting element OD may emit light during the turn-on time of the second thin film transistor TR2.

The light emitting element OD includes a luminescent material. The light emitting element OD may generate light having a color corresponding to the luminescent material. The color of the light generated in the light emitting element OD may have one of a red color, a green color, a blue color, and a white color.

FIG. 3B illustrates an embodiment of one thin film transistor TR and one light emitting element OD of the constituents of the pixel PX. The thin film transistor TR may correspond to the second thin film transistor TR2 of FIG. 3A.

The thin film transistor TR is disposed on the insulating layer 10. The thin film transistor TR may constitute a circuit layer together with the circuit insulating layer 20. The thin film transistor TR includes a semiconductor pattern SP, a control electrode CE, an input electrode IE, and an output electrode OE. The circuit insulating layer 20 may include a first circuit insulating layer 21 and a second circuit insulating layer 22, which are sequentially laminated on the insulating substrate 10.

The semiconductor pattern SP is disposed on the insulating substrate 10. The semiconductor pattern SP may include a semiconductor material. The control electrode CE is spaced apart from the semiconductor pattern SP with a first circuit insulating layer 21 therebetween. The control electrode CE may be connected to one electrode of each of the first thin film transistor TR1 and the capacitor CAP, which are described above.

The input electrode IE and the output electrode OE may be spaced apart from the control electrode CE with the second insulating layer therebetween. The input electrode IE and the output electrode OE of the transistor TR may 20-OPbe connected to two opposing sides of the semiconductor pattern SP by passing through the first circuit insulating layer 21 and the second circuit insulating layer 22, respectively.

In the thin film transistor TR, the control electrode CE may be disposed under the semiconductor pattern SP, and the input electrode IE and the output electrode OE may be disposed under the semiconductor pattern SP or be disposed in a same layer as the semiconductor pattern SP to be directly connected to the semiconductor pattern SP. The thin film transistor TR according to an embodiment of the invention may be modified to have various structures, but is not limited to any one embodiment.

The light emitting element OD is disposed on the circuit insulating layer 20. The light emitting element OD may constitute a display element layer together with the display insulating layer 30. The light emitting element OD includes a first electrode E1, an emission layer EL, a control layer EL, and a second electrode E2 (shown in FIG. 5A). The display insulating layer 30 may include a first display insulating layer 31 and a second display insulating layer 32, which are sequentially laminated one on another. Each of the first display insulating layer 31 and the second display insulating layer 32 may include an organic material and/or an inorganic material.

The first electrode E1 may be connected to the thin film transistor TR by passing through the first display insulating layer 31. Although not shown, in an alternative embodiment, the display panel 100 may further include a separate connection electrode disposed between the first electrode E1 and the thin film transistor TR. In such an embodiment, the first electrode E1 may be electrically connected to the thin film transistor TR through the connection electrode.

The second display insulating layer 32 is disposed on the first display insulating layer 31. An opening may be defined in the second display insulating layer 32. The opening may expose at least a portion of the first electrode E1. The second display insulating layer 32 may be a pixel defining layer.

The emission layer EL may be disposed on the opening and also disposed on the first electrode E1 exposed by the opening. The emission layer EL may include a light emitting material. In one embodiment, for example, the emission layer EL may include or be made of at least one material selected from materials that emit light having red, green, and blue colors and include fluorescent material or a phosphorescent material. Also, the emission layer EL may include an organic material and/or an inorganic material. The emission layer EL may emit light in response to a difference in potential between the first electrode E1 and the second electrode E2.

The control layer OL is disposed between the first electrode E1 and the second electrode E2. The control layer OL is disposed adjacent to the emission layer EL. In an embodiment, the control layer OL may be disposed between the emission layer EL and the second electrode E2. However, this is merely an example. In one alternative embodiment, for example, the control layer OL may be disposed between the emission layer EL and the first electrode E1 and may be provided as a plurality of layers that are laminated in the third direction DR3 with the emission layer EL therebetween.

The control layer OL may have an integrated shape that extends from the active area DA to the peripheral area NDA. The control layer OL may be commonly provided to the plurality of pixels.

The second electrode E2 is disposed on the emission layer EL. The second electrode E2 may have an integrated shape that extends from the active area DA to the peripheral area NDA. The second electrode E2 may be commonly provided to the plurality of pixels.

The second electrode E2 may face the first electrode E1. The second electrode E2 may be connected to the power terminal VSS of FIG. 2A. The light emitting element OD receives a second power voltage from the power terminal VSS through the second electrode E2.

The second electrode E2 may include a transmissive conductive material or a transflective conductive material. Thus, light generated in the emission layer EL may be easily emitted in the third direction DR3 through the second electrode E2. However, this is merely an example. In one alternative embodiment, for example, the light emitting element OD may be driven in a bottom emission manner including a transmissive or semi-transmissive material or may be driven in a double-side emission manner in which light is emitted from all of the front and rear surfaces, but is not limited to any one embodiment.

The encapsulation layer 40 may be disposed on the light emitting element OD to encapsulate the light emitting element OD. The encapsulation layer 40 may have an integrated shape that extends from the active area DA to the peripheral area NDA. The encapsulation layer 40 may be commonly provided to the plurality of pixels. Although not shown, a capping layer covering the second electrode E2 may be further disposed between the second electrode E2 and the encapsulation layer 40.

The encapsulation layer 40 may include a first inorganic layer 41, an organic layer 42, and a second inorganic layer 43, which are sequentially laminated in the third direction DR3. However, the embodiment of the invention is not limited thereto. In one alternative embodiment, for example, the encapsulation layer 40 may further include a plurality of inorganic layers and organic layers.

The first inorganic layer 41 may cover the second electrode E2. The first inorganic layer 41 may prevent external moisture or oxygen from being permeated to into the light emitting element OD. In one embodiment, for example, the first inorganic layer 41 may include silicon nitride, silicon oxide, or a combination thereof. The first inorganic layer 41 may be formed through a deposition process.

The organic layer 42 may be disposed on the first inorganic layer 41 to contact the first inorganic layer 41. The organic layer 42 may provide a flat surface on the first inorganic layer 41. A curve disposed on a top surface of the first inorganic layer 41 or particles existing on the first inorganic layer 41 may be covered by the organic layer 42 to prevent the surface state of a top surface of the first inorganic layer 41 from having an influence on the constituents disposed on the organic layer 42. Also, the organic layer 42 may reduce stress between the layers contacting each other. The organic layer 42 may include an organic material and be formed through a solution process such as spin coating, slit coating, inkjet process, and the like.

The second inorganic layer 43 may be disposed on the organic layer 42 to cover the organic layer 42. The second inorganic layer 43 may be relatively stably formed on the flat surface when compared to a case where the second inorganic layer 63 is disposed on the first inorganic layer 41. The second inorganic layer 43 may encapsulate moisture discharged from the organic layer 42 prevent the moisture from being introduced. The second inorganic layer 43 may include silicon nitride, silicon oxide, or a combination thereof. The second inorganic layer 43 may be formed through a deposition process.

Although not shown, the input sensing unit ISU (see FIG. 2B) including a plurality of sensor patterns may be further disposed on the encapsulation layer 40. The sensor patterns constituting the input sensing unit ISU may be directly formed on the encapsulation layer 40 through a deposition and patterning process or may be separately formed and then bonded on the encapsulation layer 40. However, this is merely an example. In one embodiment, for example, the display panel according to an embodiment of the invention may be variously modified, but is not limited to any one embodiment.

The driving signal line CL, the peripheral dam part DM, and the power connection pattern E-VSS may be disposed on the peripheral area NDA. The driving signal line CL may be provided in plurality and disposed on the second insulating layer 20. The driving signal line CL may be a routing line connected to a pad (not shown) or a line constituting the integrated circuit IC. In one embodiment, for example, the driving signal line CL may include a power supply line, an initialization voltage line, or an emission control line.

The power connection pattern E-VSS supplies a second power voltage to the light emitting element OD. The power connection line E-VSS may correspond to the power terminal VSS of the pixel PX. The second electrode E2 extends up to the peripheral area NDA and is connected to the power connection pattern E-VSS. In an embodiment, the second power voltages supplied to the pixels PX may be a common voltage with respect to all of the pixels PX.

The peripheral dam part DM may be disposed at a position covering a portion of the power connection pattern E-VSS. In an embodiment, the peripheral dam part DM may have a multilayered structure including a first dam DM1 and a second dam DM2.

The first dam DM1 may include the same material as the first display insulating layer 31. The first dam DM1 may be formed at the same time or simultaneously with each other during a same process as the first display insulating layer 31 and may be disposed in a same layer as the first display insulating layer 31.

The second dam DM2 is laminated on the first dam DM1. In this embodiment, a portion of the second electrode E2 may be inserted between the first dam DM1 and the second dam DM2. In such an embodiment, the second dam DM2 may be formed through a separate process after the second electrode E2 is formed. This is merely an example. In one alternative embodiment, for example, the second dam DM2 may be formed simultaneously with the second display insulating layer 32. Alternatively, the peripheral dam portion DM may have a single layer structure and is not limited to any one embodiment.

The peripheral dam part DM may be disposed adjacent to at least one side of the active area DA. The peripheral dam part DM may surround the active area DA on the plane. The peripheral dam part DMP may be defined as an area into which a liquid organic material is spread in a process of forming the organic layer 42. The organic layer 42 may be formed in an inkjet manner in which the liquid organic material is applied to the first inorganic layer 41. Here, the peripheral dam part DM may set a boundary of an area on which the liquid organic material disposed and prevent the liquid organic material from overflowing to the outside of the peripheral dam part DM.

The first inorganic layer 41 and the second inorganic layer 42 may extend from the active area DA up to the outside of the peripheral dam part DM. Accordingly, the peripheral dam part DM may be covered by the first inorganic layer 41 and the second inorganic layer 43. The organic layer 42 may be disposed inside the peripheral dam part DM. However, this is merely an example. In one alternative embodiment, for example, a portion of the organic layer 42 may extend up to an area overlapping the peripheral dam part DM, but is not limited to any one embodiment.

Figure 4A:
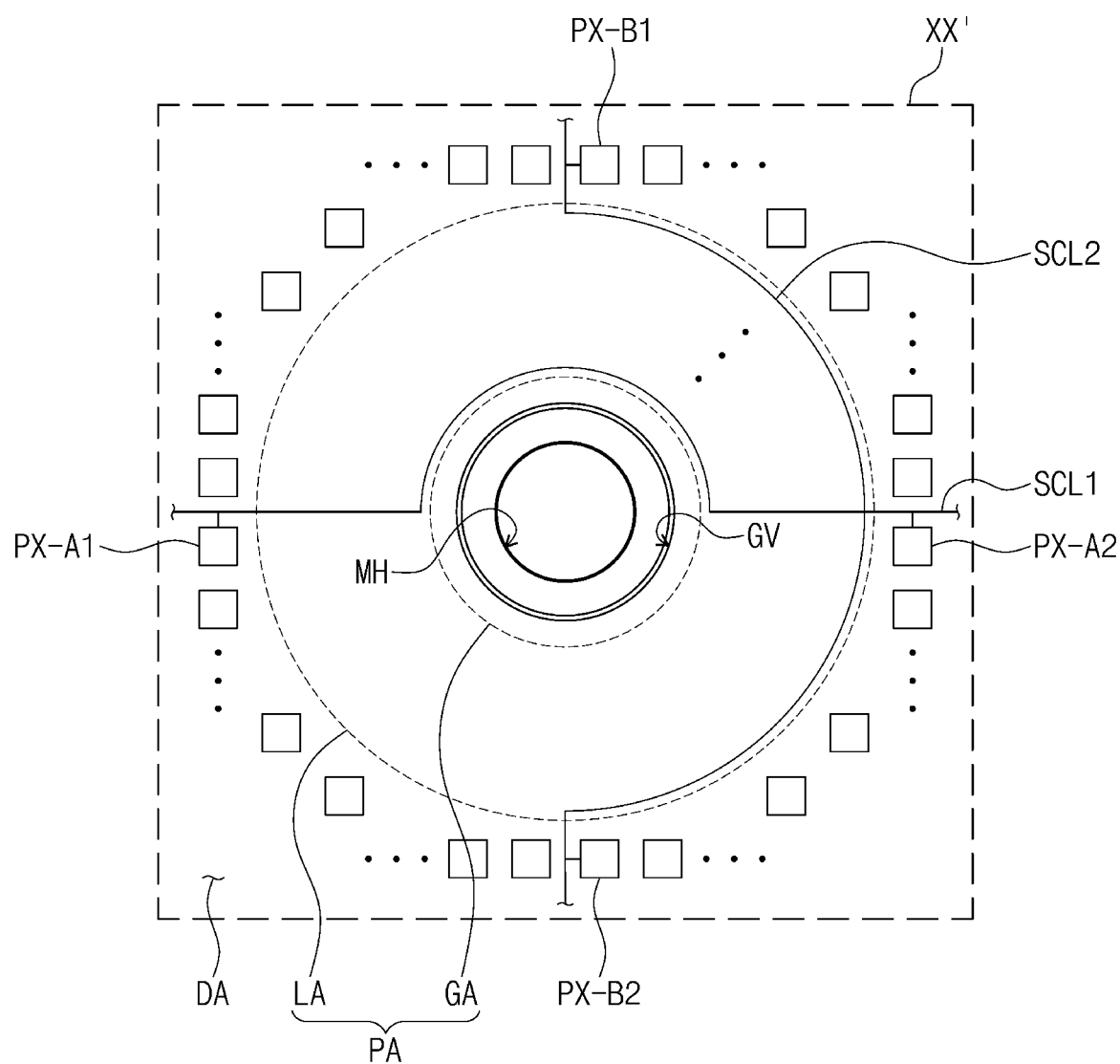
FIGS. 4A and 4B are enlarged plan views illustrating an area XX' of FIG. 2A.
Figure 4B:
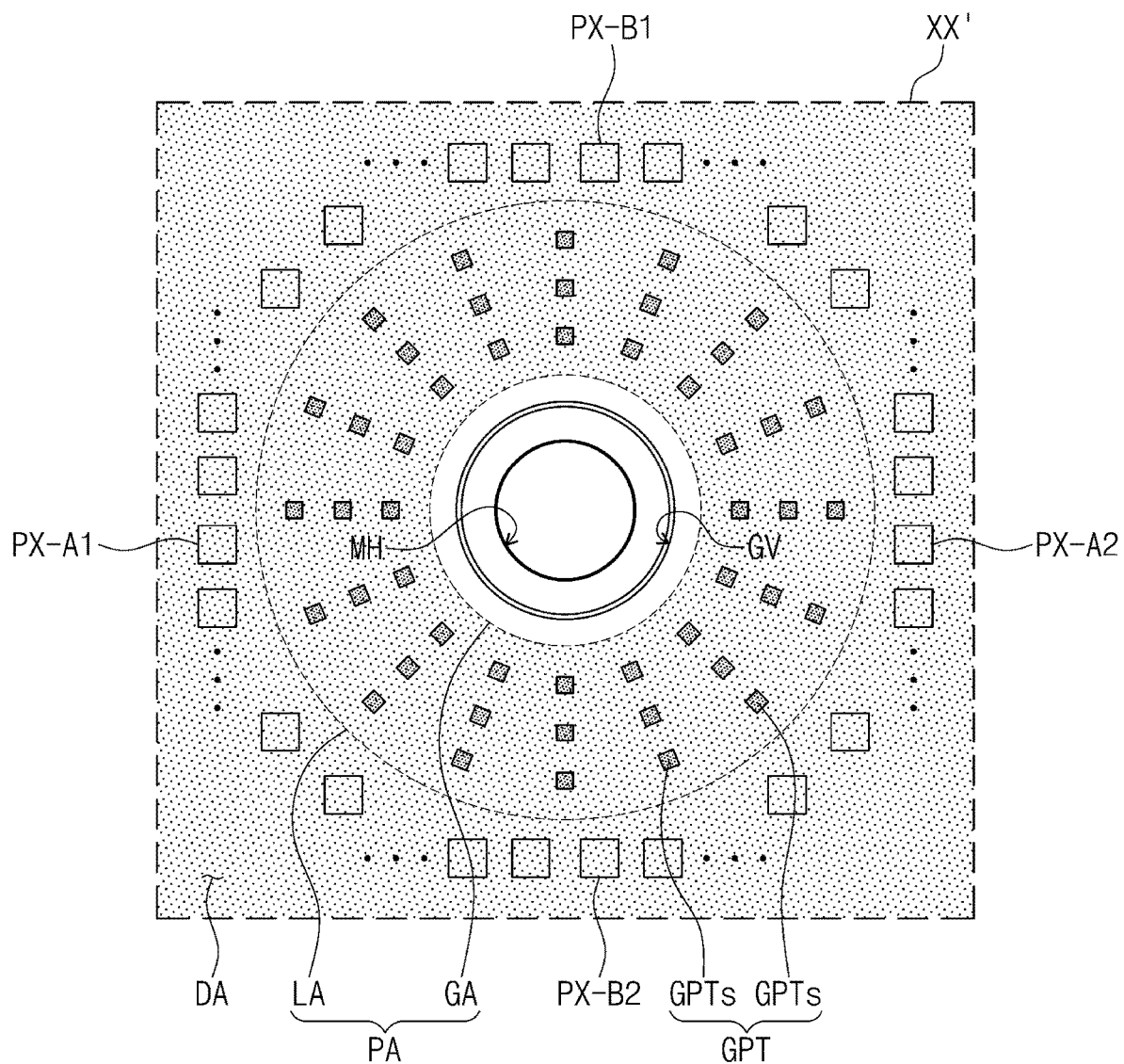

FIGS. 4A and 4B are enlarged plan views illustrating an area XX' of FIG. 2A. For convenience of description, some constituents are omitted in FIGS. 4A and 4B. When comparing FIGS. 4A and 4B with each other, the guide pattern GPT and the organic layer 42 are omitted in FIG. 4A, and signal lines are illustrated in FIG. 4B. Hereinafter, the invention will be described with reference to FIGS. 4A and 4B. The same reference numeral may be given to components that are the same as those of FIGS. 1 to 3B, and any repetitive detailed descriptions thereof will be omitted.

The hole area PA may be surrounded by the active area DA. The hole area PA may include a groove area GA and a line area LA. The module hole MH may be defined in a center of the hole area PA. Each of the line area LA and the groove area GA may surround the module hole MH. The line area LA and the groove area GA may be sequentially arranged from the active area DA in a direction adjacent to the module hole MH. In an embodiment, as shown in FIG. 4A, the groove area GA may be defined as a ring shape surrounding the module hole MH, and the line area LA may be defined as a ring shape surrounding the groove area GA.

In such an embodiment, the display panel 100 may include a plurality of signal lines SCL1 and SCL2 disposed in the hole area PA, the groove pattern GV, and the guide pattern GPT.

The signal lines SCL1 and SCL2 are connected to the pixels PX-A1, PX-A2, PX-B1, and PX-B2 via the line area LA. In FIG. 4A, two signal lines SCL1 and SCL2 and four pixels PX-A1, PX-A2, PX-B1, and PX-B2 connected to the two signal lines SCL1 and SCL2 are exemplarily illustrated for convenience of description. Hereinafter, the two signal lines SCL1 and SCL2 are referred to as a first signal line SCL1 and a second signal line SCL2, and four pixels PX-A1, PX-A2, PX-B1, and PX-B2 will be referred to as first to fourth pixels PX-A1, PX-A2, PX-B1, and PX-B2.

The first signal line SCL1 is connected to each of the first and second pixels PX-A1 and PX-A2 which are spaced apart from each other with the hole area PA therebetween. The first pixel PX-A1 and the second pixel PX-A2 may be pixels constituting the same pixel row. The first signal line SCL1 connected to the first pixel PX-A1 is connected to the second pixel PX-A2 through the line area LA of the hole area PA.

The first pixel PX-A1 and the second pixel PX-A2 are connected through the first signal line SCL1 to receive the same electrical signal as each other. In one embodiment, for example, the first signal line SCL1 may correspond to the gate line GL (see FIG. 3A) illustrated in FIG. 3A. Thus, the first pixel PX-A1 and the second pixel PX-A2, which are spaced apart from each other with the module hole MH therebetween, may be turned on/off by substantially the same gate signal.

The second signal line SCL2 is connected to each of the third and fourth pixels PX-B1 and PX-B2 that are spaced apart from each other with the hole area PA therebetween. The third pixel PX-B1 and the fourth pixel PX-B2 may be pixels constituting the same pixel column. The first signal line SCL1 connected to the third pixel PX-B1 is connected to the fourth pixel PX-B2 via the line area LA of the hole area PA.

The third pixel PX-B1 and the fourth pixel PX-B2 are connected through the second signal line SCL2 to receive the same electrical signal. In one embodiment, for example, the second signal line SCL2 may correspond to the data line DL (see FIG. 3A) illustrated in FIG. 3A. Thus, the third pixel PX-B1 and the fourth pixel PX-B2, which are spaced apart from each other with the module hole MH therebetween, may receive substantially the same data signal.

In an embodiment, the first signal line SCL1 and the second signal line SCL2 may be patterns disposed only on the line area LA. Here, each of the first signal line SCL1 and the second signal line SCL2 may function as bridge patterns, which are connected to signal lines that are respectively connected to the pixels PX-A1, PX-A2, PX-B1, and PX-B2 to connect the signal lines to each other. However, this is merely an example. In one alternative embodiment, for example, the display panel 100 includes a plurality of signal lines disposed on the line area LA to improve organic coupling between the pixels that are spaced apart from each other with respect to the module hole MH, such that electrical control of the pixels spaced apart from each other with respect to the module hole MH may be facilitated.

The groove pattern GV may be disposed on the groove area GA. The groove pattern GV may be a pattern recessed from the front surface of the display panel 100. The recess pattern GV may be provided by removing a portion of the constituents of the display panel 100 to be recessed from the front surface of the display panel 100. This will be described later in detail.

The groove pattern GV may not be defined or formed through the display panel 100 unlike the module hole MH. Thus, the groove pattern GV may not extend to a rear surface of at least the insulating substrate 10.

The groove pattern GV may surround the module hole MH. The groove GV may have a closed line shape surrounding the module hole MH. In FIG. 4A, the groove pattern GV is illustrated in the shape of a circular closed line. However, this is merely an example. In one alternative embodiment, for example, the groove pattern GV may have one of other various closed line shapes such as a polygon shape or an oval shape, but is not limited to any one embodiment.

The guide pattern GPT may be disposed between the pixels PX-A1, PX-A2, PX-B1, and PX-B2 and the groove pattern GV when viewed on the plane. In one embodiment, for example, the guide pattern GPT may be disposed on the line area LA. The guide pattern GPT may include a plurality of patterns GPTs spaced apart from each other. The patterns GPTs may be radially arranged around the module hole MH. In FIG. 4B, the patterns GPTs are illustrated as being arranged four by four in a direction from the center of the module hole MH toward the active area. However, this is merely an example. In one embodiment, for example, the patterns GTPs may be arranged in various numbers and is not limited to any one embodiment.

The guide pattern GPT improves uniformity in spreading of the organic layer 42. In FIG. 4B, the organic layer 42 is shaded for convenience of illustration and description. In an embodiment, as shown in FIG. 4B, the organic layer 42 is provided on the line area LA. However, this is merely an example. In one alternative embodiment, for example, the organic layer 42 may be provided to extend up to the groove area GA, but is not limited to any one embodiment.

The organic layer 42 covers the guide pattern GPT. When viewed on the plane, the organic layer 42 and the guide pattern GPT may overlap each other. The organic layer 42 may be provided to have an even thickness on the hole area PA by the guide pattern GPT. Also, an area on which the organic layer 42 is provided in the hole area PA may be evenly distributed by the guide pattern GPT.

According to an embodiment of the invention, since the organic layer 42 is uniformly spread in the hole area PA, an area occupied by the organic layer 42 in the hole area PA may be easily designed. In such an embodiment, due to the uniform coating of the organic layer 42 in the hole area PA, in particular, the line area LA in which the guide pattern GPT is disposed, the organic layer may be prevented from excessively overflowing to the groove area via the line area LA. Thus, the organic layer 42 may be stably provided in the hole area PA, in particular, the line area LA.

Figure 5A:
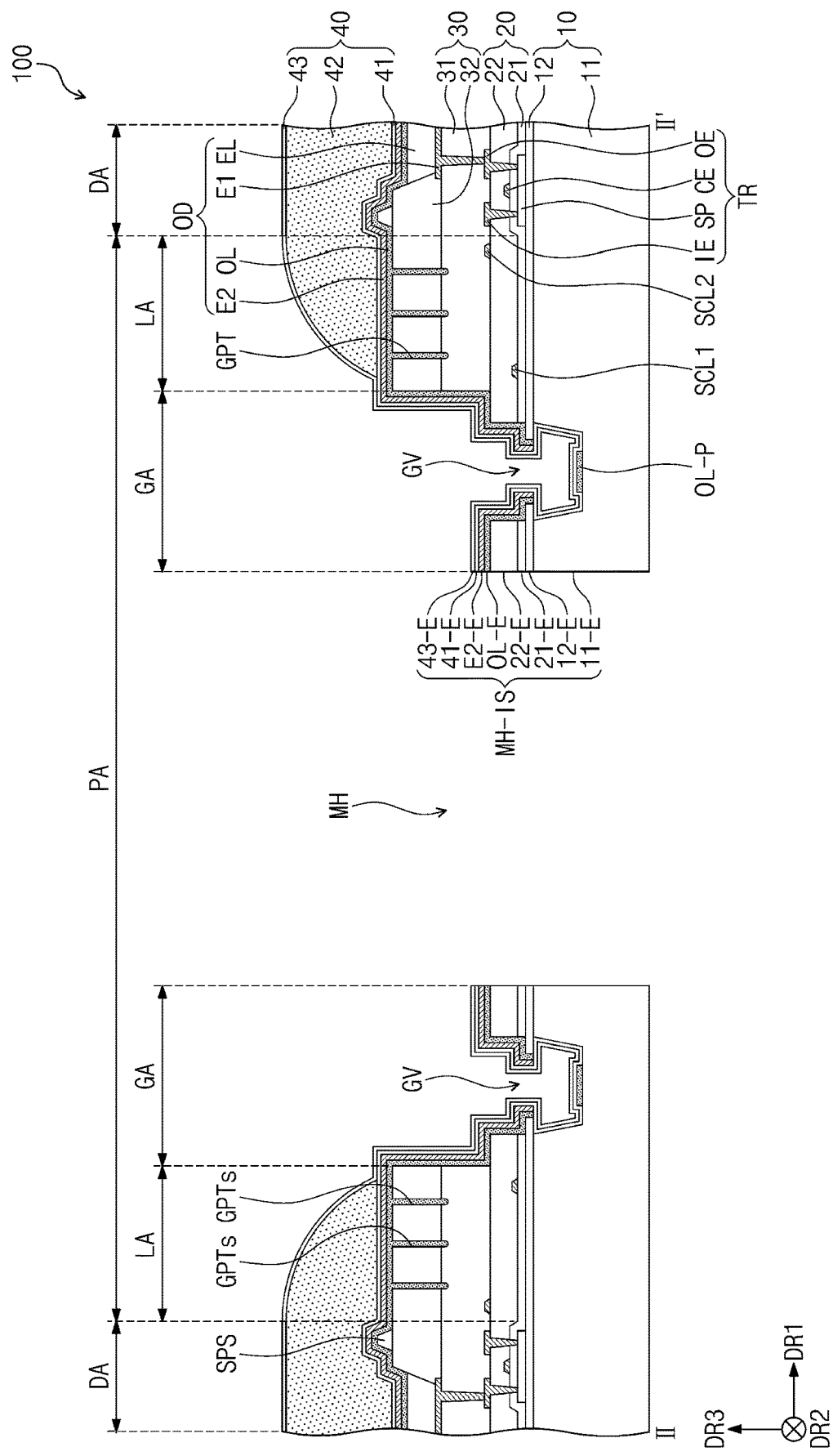
FIG. 5A is a cross-sectional view taken along line II-II' of FIG. 2A.
Figure 5B:
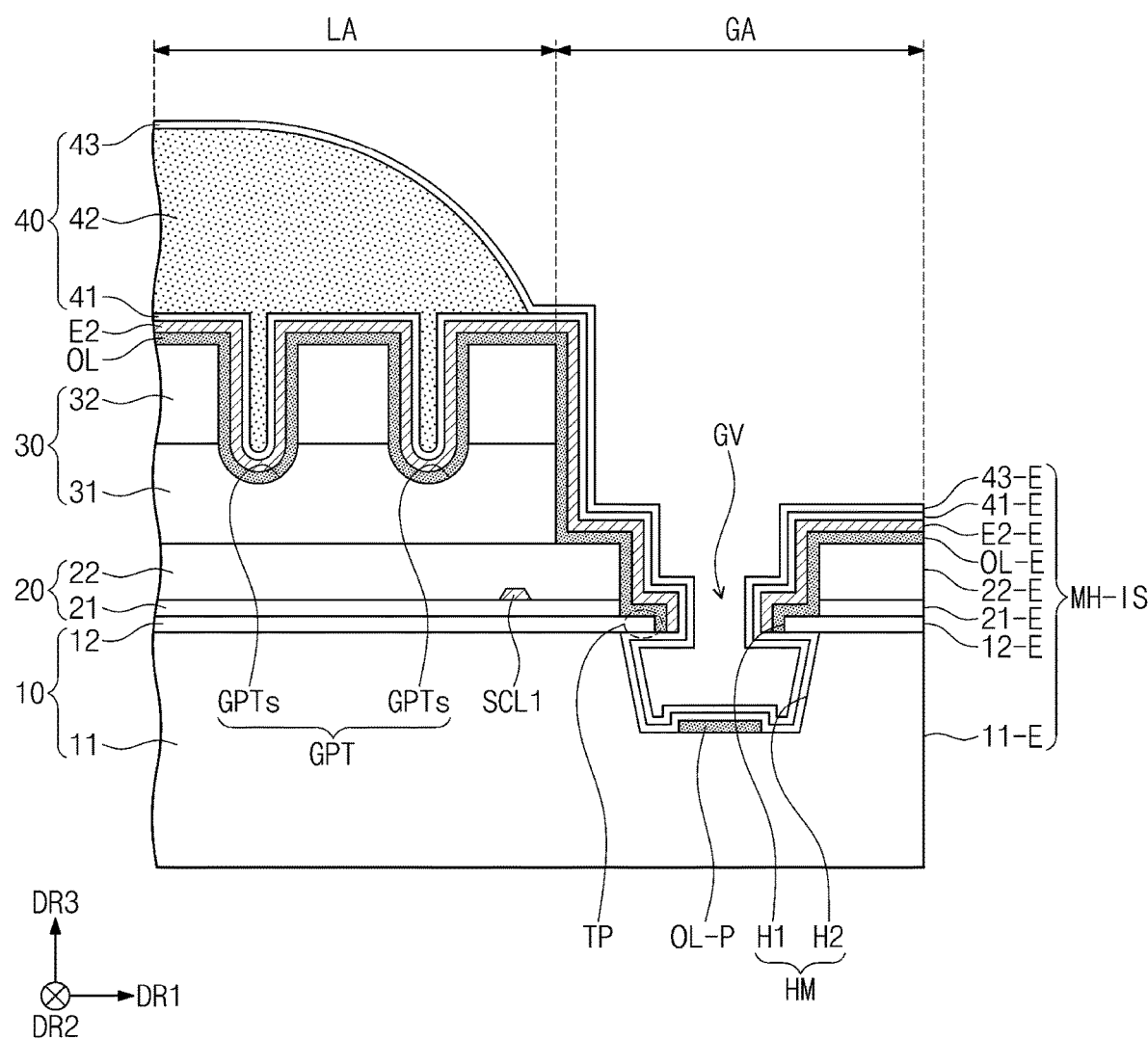
FIG. 5B is a cross-sectional view illustrating a portion of constituents of FIG. 5A.

FIG. 5A is a cross-sectional view taken along line II-II' of FIG. 2A, and FIG. 5B is a cross-sectional view illustrating a portion of constituents of FIG. 5A. For convenience of illustration and description, in FIGS. 5A and 5B, some areas are enlarged or reduced. Hereinafter, an embodiment of the invention will be described with reference to FIGS. 5A and 5B.

As illustrated in FIG. 5A, the module hole MH is spaced apart from the pixels disposed on the active area DA and also disposed in the hole area PA. The module hole MH may be defined in a center of the hole area PA. The module hole MH may be a through-hole defined or formed through the display panel 100. The module hole MH passes through the constituents disposed in the hole area PA among the constituents of the display panel 100.

In an embodiment, the module hole MH be defined through the base layer 11, the auxiliary layer 12, the first circuit insulating layer 21, the second circuit insulating layer 22, the first display insulating layer 31, the second display insulating layer 32, the control layer OL, the second electrode E2, the first inorganic layer 41, and the second inorganic layer 43. Accordingly, an inner surface MH-IS of the module hole MH may be defined by a cross-section 11-E of the base layer, a cross-section 12-E of the auxiliary layer, a cross-section 21-E of the first insulating layer, a cross-section 22-E of the second insulating layer, a cross-section 31-E of the first display insulating layer, the cross-section 32-E of the second display insulating layer, a cross-section OL-E of the control layer, a second electrode E2-E of the second electrode, a cross-section 41-E of the first inorganic layer, and a cross section 43-E of the second inorganic layer.

In an embodiment, the groove pattern GV may be defined on the groove area GA surrounding the module hole MH, and the guide pattern GPT may be defined on the line area LA surrounding the groove pattern GV. Hereinafter, the groove pattern GV and the guide pattern GPT will be described in detail with reference to FIG. 5B.

The groove pattern GV may be disposed to correspond to a groove part HM of the insulating substrate 10. The groove pattern GV may have a position on the plane corresponding to the groove part HM and a shape in a cross-section. That is, a predetermined recessed space provided by the groove pattern GV may be similar in position and shape to the recessed space provided by the groove part HM.

The groove pattern GV may be provided by covering an inner surface of the groove part HM by at least one of the first inorganic layer 41 or the second inorganic layer 43. A portion of the first inorganic layer 41 or the second inorganic layer 43 that covers the inner surface of the groove part HM may be recessed rather than a portion covering the periphery of the groove part HM to provide the groove pattern GV having a predetermined recessed space. The first inorganic layer 41 covers the inner surface of the groove part HM and defines the inner surface of the groove pattern GV. Accordingly, the inner surface of the groove pattern GV may have a shape corresponding to that of the inner surface of the groove part HM. In an embodiment, the groove pattern GV is illustrated as the groove part HM covered by the first inorganic layer 41 and the second inorganic layer 43.

The groove part HM may be provided by passing through remaining constituents except for only a portion of the base layer 11 of the insulating to substrate 10. The groove part HM may include a first portion H1 defined in the auxiliary layer 12 and a second portion H2 defined in the base layer 11.

The first portion H1 may be a through-hole defined through the auxiliary layer 12. The first portion H1 may define an inlet portion of the groove part HM. The second part H2 may be a recess pattern provided by removing a portion of the base layer 11. The second portion H2 is provided to be recessed from a top surface of the base layer 11. The top surface of the base layer 11 may be a surface in contact with the auxiliary layer 12. This is merely an example. In one embodiment, for example, a shape or depth of the groove part HM may vary according to a layer configuration of the insulating substrate 10, but is not limited to any one embodiment.

In an embodiment, the base layer 11 may be provided by being relatively under-cut with respect to the auxiliary layer 12. Accordingly, the groove part HM may have an under-cut shape so that an end of the auxiliary layer 12 defines a tip part TP protruding toward the inside of the groove part HM. In such an embodiment, a width of the first portion H1 may be less than that of an upper side of the second portion H2. The tip part TP defining the first portion H1 of the auxiliary layer 12 may overlap the second portion H2 when viewed from the plane. The display panel 100 according to an embodiment of the invention may have various layer structures as long as the tip part TP is provided in the groove part HM, but is not limited to any one embodiment.

The first inorganic layer 41 covers the inner surface of the groove part HM. In an embodiment, the first inorganic layer 41 covers an inner side of the first portion H1 and an inner side of the second portion H2, which constitute the groove part HM. The second inorganic layer 43 is disposed along the first inorganic layer 41. Thus, the tip part TP may provide the groove pattern GV while being covered by the first and second inorganic layers 41 and 43.

The organic layer 42 is disposed on the light emitting element OD. In an embodiment, the organic layer 42 may be spaced apart from the groove pattern GV. The organic layer 42 may be disposed on the guide pattern GPT and sealed by the first inorganic layer 41 and the second inorganic layer 43. Accordingly, a spaced distance between the organic layer 42 and the module hole MH, which may act as a moving path through which external contamination/moisture permeated from the module hole MH, may increase to prevent the display panel from being damaged by the external contamination, thereby improving process reliability of the display panel 100.

Alternatively, although not shown, the organic layer 42 according to an embodiment of the invention may extend up to the groove area GA in which the groove pattern GV is disposed to fill at least a portion of the groove pattern GV. The organic layer 42 may support the tip part TP by filling the inside of the groove pattern GV. Accordingly, damage of the tip part TP due to the protruding shape of the tip part TP may be prevented to improve durability of the display panel 100.

The display panel 100 according to an embodiment of the invention may be variously modified, but is not limited to one embodiment.

In an embodiment, the control layer OL and the second electrode E2 may be provided after the auxiliary layer 12 and a portion of the first circuit insulating to layer 21 are removed. The control layer OL and the second electrode E2 may be provided through a deposition process. Thus, the control layer OL and the second electrode E2 may cover a side surface of the auxiliary layer 12 that defined the first portion H1 of the groove part HM. Thereafter, the control layer OL and the second electrode E2 may be covered by the first inorganic layer 41.

The display panel 100 may further include a predetermined additional organic pattern OL-P disposed in the groove part HM. The additional organic pattern OL-P may include the same material as at least one of the control layer OL or the second electrode E2. The additional organic pattern OL-P may be spaced apart from the control layer OL and the second electrode E2 and disposed in the groove HM and also may be covered by the first inorganic layer 41 not to be exposed to the outside.

The guide pattern GPT may be disposed between the light emitting element OD and the groove pattern GV when viewed on the plane. The guide pattern GPT may be a recess pattern defined in the first display insulating layer 31 or the second display insulating layer 32.

The guide pattern GPT may have a depth defined by passing through the second display insulating layer 32 and removing at least a portion of the first display insulating layer 31. The guide pattern GPT may have a shape that passes through the second display insulating layer 32 and is recessed from a top surface of the first display insulating layer 31 when viewed in cross-section.

The guide pattern GPT may be constituted by the patterns GPTs, each of which is recessed from a top surface of the second display insulating layer 32. In an embodiment, the patterns GPTs may be recess patterns having the same width and the same depth as each other, as shown in FIG. 5B. However, this is merely an example. In one alternative embodiment, for example, the widths or depths of the patterns GPTs may be different from each other according to a process error or process design, but are not limited to any one embodiment.

In an embodiment, the control layer OL, the second electrode E2, and the first inorganic layer 41 may be disposed along an inner surface of each of the patterns GPTs. Thus, even when the control layer OL, the second electrode E2, and the first inorganic layer 41 are provided, the depressed shape of the guide pattern GPT may be stably maintained.

In an embodiment, the organic layer 42 may be formed by applying a liquid organic material to the active area DA through a solution process such as a screen printing process or an inkjet process. The liquid organic material having a predetermined spreading property may be gradually spread from the center of the active area DA toward the hole area PA. While the liquid organic material covers the guide pattern GPT, the recessed shape of the guide pattern GPT may be partially filled. A flow rate or spreadability of the liquid organic material may be controlled by the guide pattern GPT. Thus, the organic layer 42 may be formed with the liquid organic material evenly spread within the line area LA by the guide pattern GPT.

In an embodiment, as shown in FIG. 5A, the display panel 100 may further include a spacer SPS. The spacer SPS may protrude from the top surface of the second display insulating layer 32. The spacer SPS may be independent from the second display insulating layer 32 and may be disposed between the second display insulating layer 32 and the control layer OL or be integrated with the second display insulating layer 32, that is, defined by a protruding portion of the second display insulating layer 32. The spacer SPS may include an insulating material. The spacer SPS may support a mask so that the mask used to form the emission layer EL prevents from contacting the second display insulating layers 32 when disposed thereon during a manufacturing process. However, this is merely an example. In an alternative embodiment of the display panel 100, the spacer SPS may be omitted. The display apparatus 100 according to an embodiment of the invention may have various shapes, but is not limited to any one embodiment.

Figure 6A:
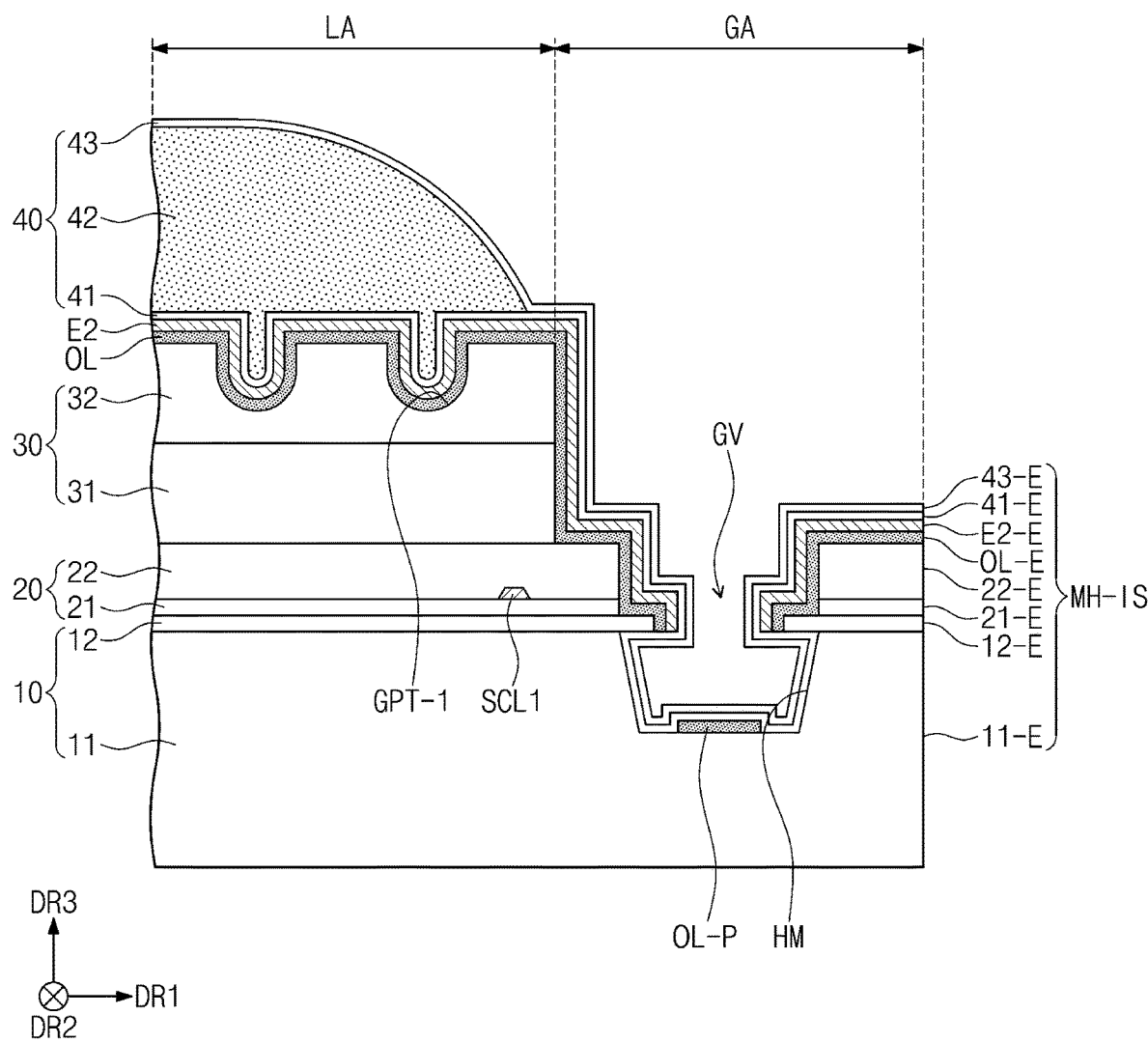
FIGS. 6A to 6C are cross-sectional views illustrating display panels according to an alternative embodiment of the invention.
Figure 6B:
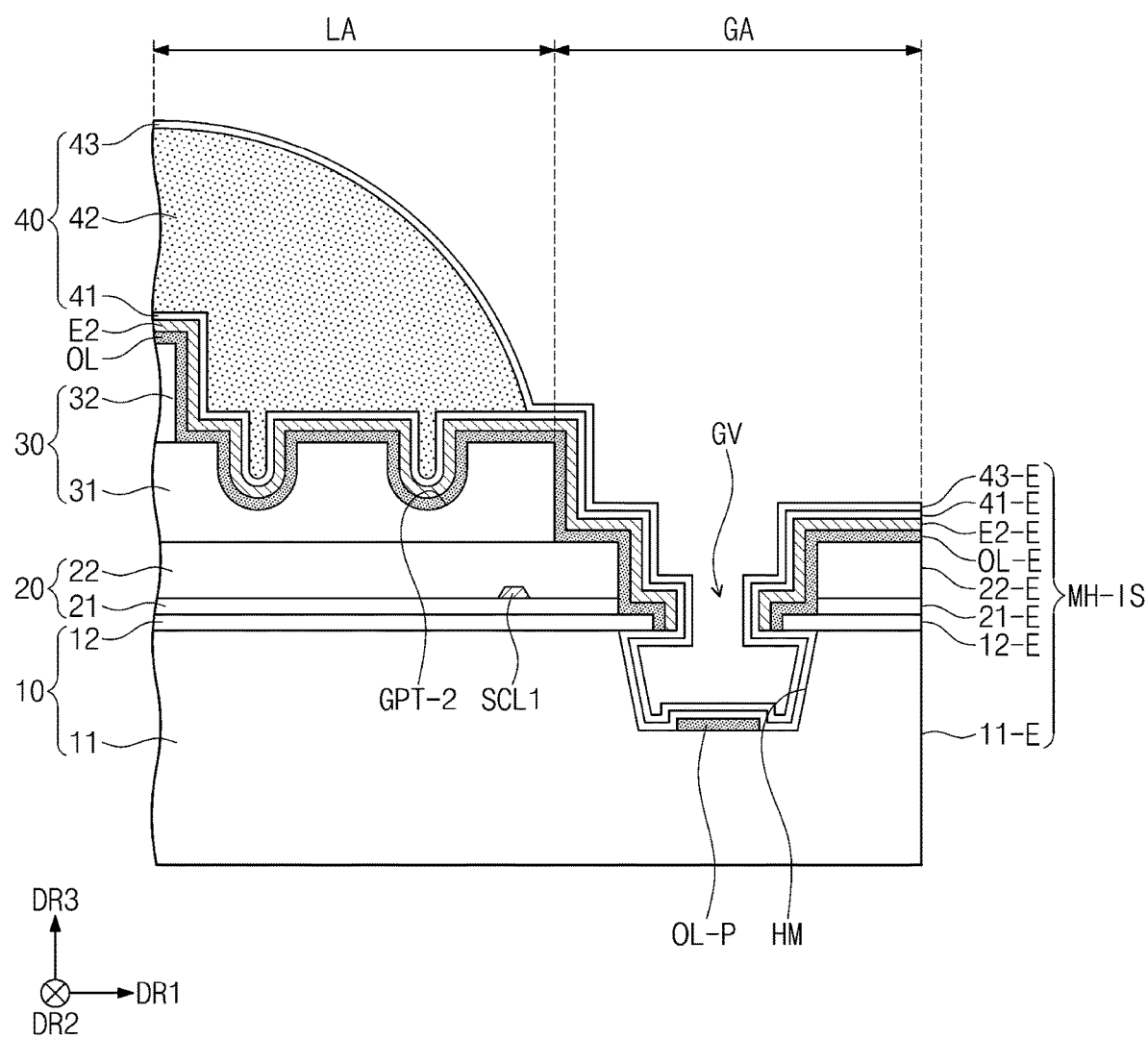
Figure 6C:
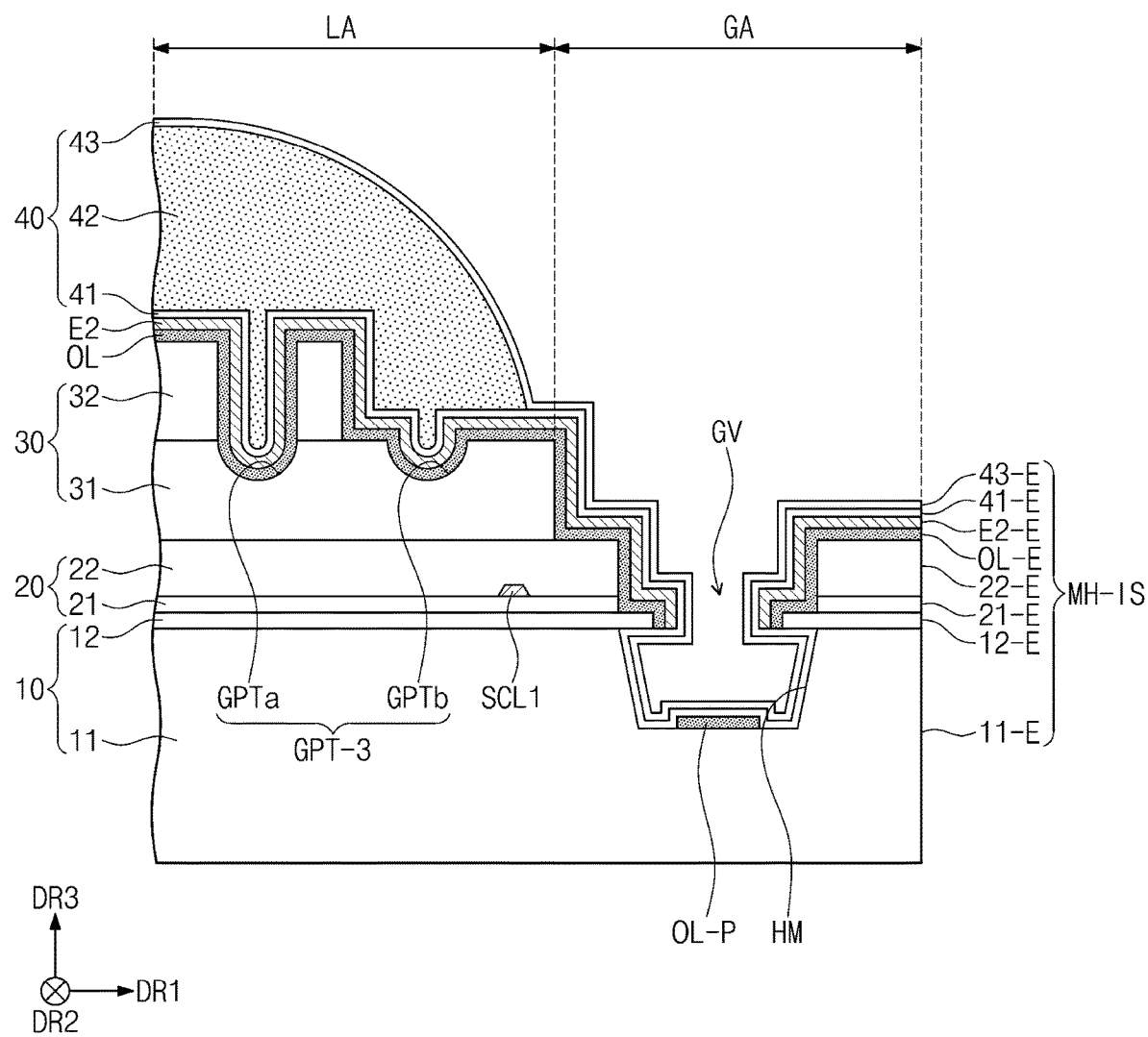

FIGS. 6A to 6C are cross-sectional views illustrating display panels according to an alternative embodiment of the invention. For convenience of description, areas corresponding to the area illustrated in FIG. 5B are illustrated in FIGS. 6A to 6C. Hereinafter, alternative embodiments of the disclosure will be described with reference to FIGS. 6A to 6C.

As illustrated in FIG. 6A, in an alternative embodiment, a guide pattern GPT-1 may be a recess pattern defined in the second display insulating layer 32. The guide pattern GPT-1 has a shape recessed from the top surface of the second display insulating layer 32.

The guide pattern GPT-1 may have a depth defined by removing a portion of the second display insulating layer 32 without reaching the first display insulating layer 31. The guide pattern GPT-1 may have a shape that is depressed from the top surface of the second display insulating layer 32 and spaced apart from the first display insulating layer 31 when viewed in cross-section.

Alternatively, as illustrated in FIG. 6B, a guide pattern GPT-2 may be a recess pattern defined in the first display insulating layer 31. The guide pattern GPT-2 has a shape recessed from the top surface of the first display insulating layer 31. The guide pattern GPT-2 may have a depth defined by removing a portion of the first display insulating layer 31 without reaching the second circuit insulating layer 22.

The guide pattern GPT-2 has a shape spaced apart from the second display insulating layer 32 when viewed on the plane. The guide pattern GPT-2 may be exposed from the second display insulating layer 32 so that the recessed shape of the guide pattern GPT-2 is stably exposed to the organic layer 42.

Alternatively, as illustrated in FIG. 6C, a guide pattern GPT-3 may be a recess pattern defined in each of the first display insulating layer 31 and the second display insulating layer 32. The guide pattern GPT-3 may include a first recess pattern GPTa defined in the second display insulating layer 32 and a second recess pattern GPTb defined in the first display insulating layer 31.

The first recess pattern GPTa is recessed from the top surface of the second display insulating layer 32 and spaced apart from the first display insulating layer 31 in cross-section. The second recess pattern GPTb is recessed from the top surface of the first display insulating layer 31 and spaced apart from the second circuit insulating layer 22 in cross-section. A distance by which the first recess pattern GPTa is spaced apart from the top surface of the second circuit insulating layer 22 and a distance by which the second recess pattern GPTb is spaced apart from the top surface of the second circuit insulating layer 22 may be the same as or different from each other.

The first recess pattern GPTa and the second recess pattern GPTb may be disposed to be spaced apart from each other when viewed on the plane. The second recess pattern GPTb may be exposed from the second display insulating layer 32. Thus, the recessed shape of each of the first recess pattern GPTa and the second recess pattern GPTb is stably exposed to the organic layer 42 so that the spreadability of the organic layer 42 is easily controlled.

Figure 7A:
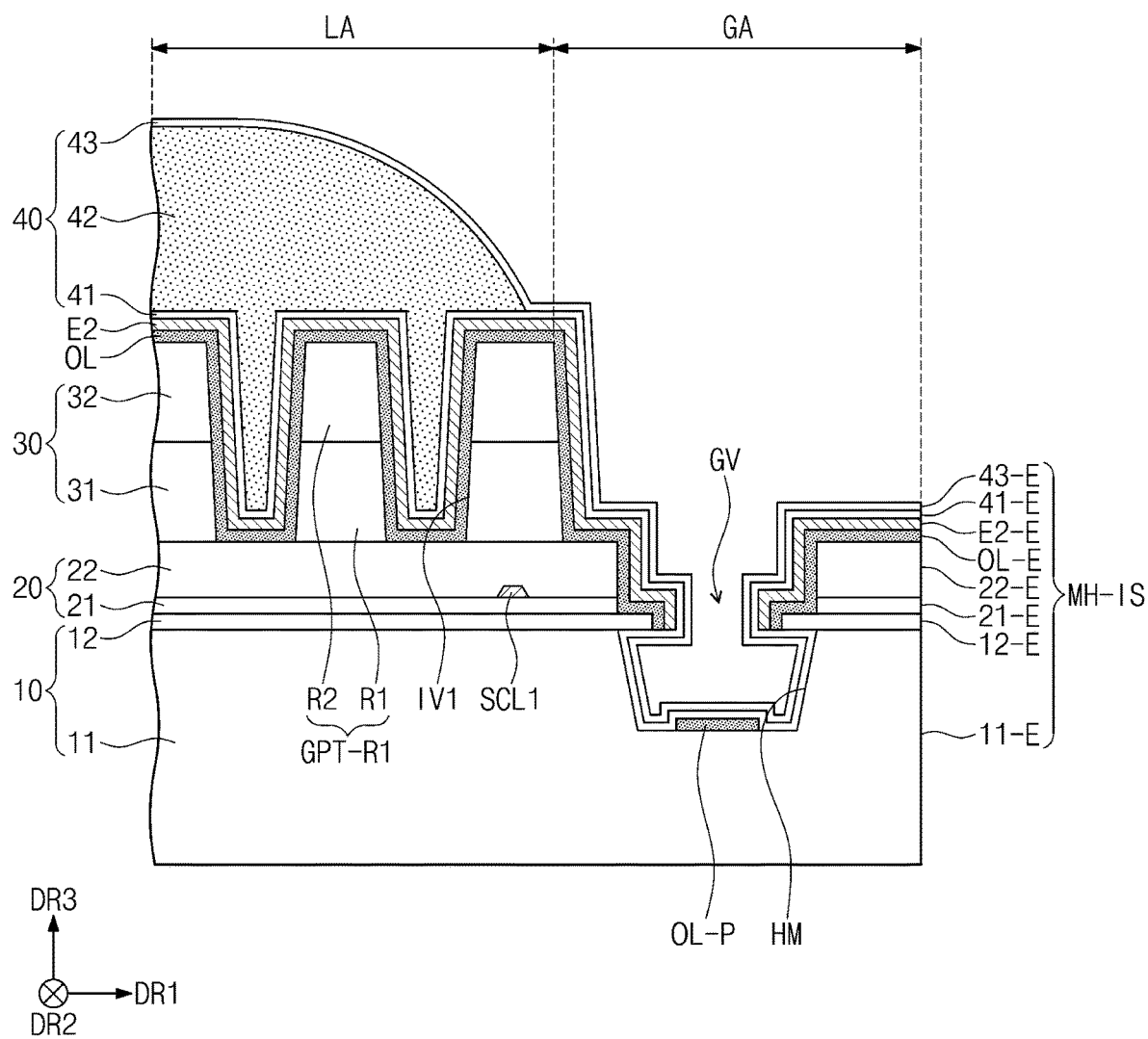
FIGS. 7A and 7B are cross-sectional views illustrating a partial area of the electronic panel according to an alternative embodiment of the invention.
Figure 7B:
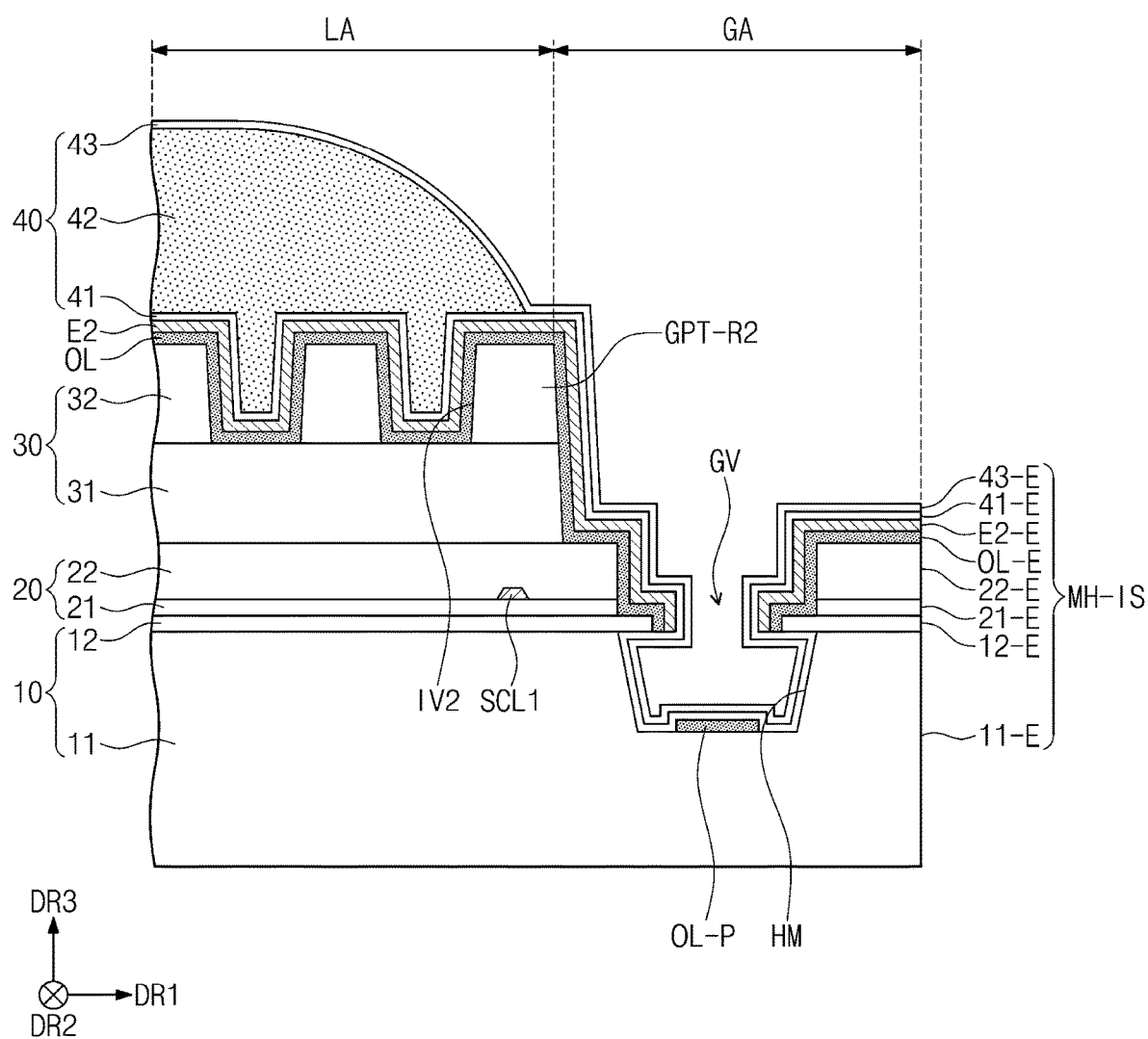

FIGS. 7A and 7B are cross-sectional views illustrating a partial area of the electronic panel according to an alternative embodiment of the invention. For convenience of description, FIGS. 7A and 7B illustrate an area corresponding to that of FIG. 5B. Hereinafter, alternative embodiments of the invention will be described with reference to FIGS. 7A and 7B. The same reference numeral may be given to components that are the same as those of FIGS. 1 to 6C, and any repetitive detailed descriptions thereof will be omitted.

As illustrated in FIGS. 7A and 7B, guide patterns GPT-R1 and GPT-R2 according to an embodiment of the invention may be protruding patterns spaced apart from the first display insulating layer 31 and the second display insulating layer 32 when viewed on the plane. Each of the guide patterns GPT-R1 and GPT-R2 illustrated in FIGS. 7A and 7B may have a configuration that is independent and separable from the insulating layers 31 and 32 of the display layer.

In one embodiment, for example, as illustrated in FIG. 7A, the guide pattern GPT-R1 may have a space that is spaced apart from the first display insulating layer 31 and the second display insulating layer 32 and protrudes from the top surface of the second circuit insulating layer 22. In such an embodiment, the guide pattern GPT-R1 may be a laminated structure including a first layer R1 and a second layer R2. The first layer R1 may be disposed in a same layer as the first display insulating layer 31 and may include the same material as the first display insulating layer 31. The second layer R2 may be disposed on the first layer R1, disposed in a same layer as the second display insulating layer 32, and include the same material as the second display insulating layer 32.

The organic layer 42 may cover the guide pattern GPT-R1. At least a portion of the organic layer 42 may be filled in a space IV1 between the plurality of protruding patterns constituting the guide pattern GPT-R1 or a space between the guide pattern GPT-R1 and the display insulating layer 30. The guide pattern GPT-R1 may allow an area, on which the organic layer 42 is formed, to be freely designed by controlling the spreadability of the organic layer 42.

Alternatively, for example, as illustrated in FIG. 7B, the guide pattern GPT-R2 may include a protruding pattern disposed on the first display insulating layer 31 and spaced apart from the second display insulating layer 32. The guide pattern GPT-R2 has a shape that protrudes from the top surface of the first display insulating layer 31 and is spaced apart from the second display insulating layer 32.

At least a portion of the organic layer 42 may be filled in a space IV2 between the plurality of protruding patterns constituting the guide pattern GPT-R2 or a space between the guide pattern GPT-R2 and the second display insulating layer 32. The guide pattern GPT-R2 may allow an area, on which the organic layer 42 is formed, to be freely designed by controlling the spreadability of the organic layer 42.

FIGS. 8A to 8D are schematic plan views illustrating partial areas of the display panels according to an alternative embodiment of the invention. In FIGS. 8A to 8D, an area corresponding to the hole area PA (see FIG. 4B) of the areas illustrated in FIG. 4B is schematically illustrated. Hereinafter, alternative embodiments of the invention will be described with reference to FIGS. 8A to 8D. The same reference numeral may be given to components that are the same as those of FIGS. 1 to 7, and any repetitive detailed descriptions thereof will be omitted.

Figure 8A:
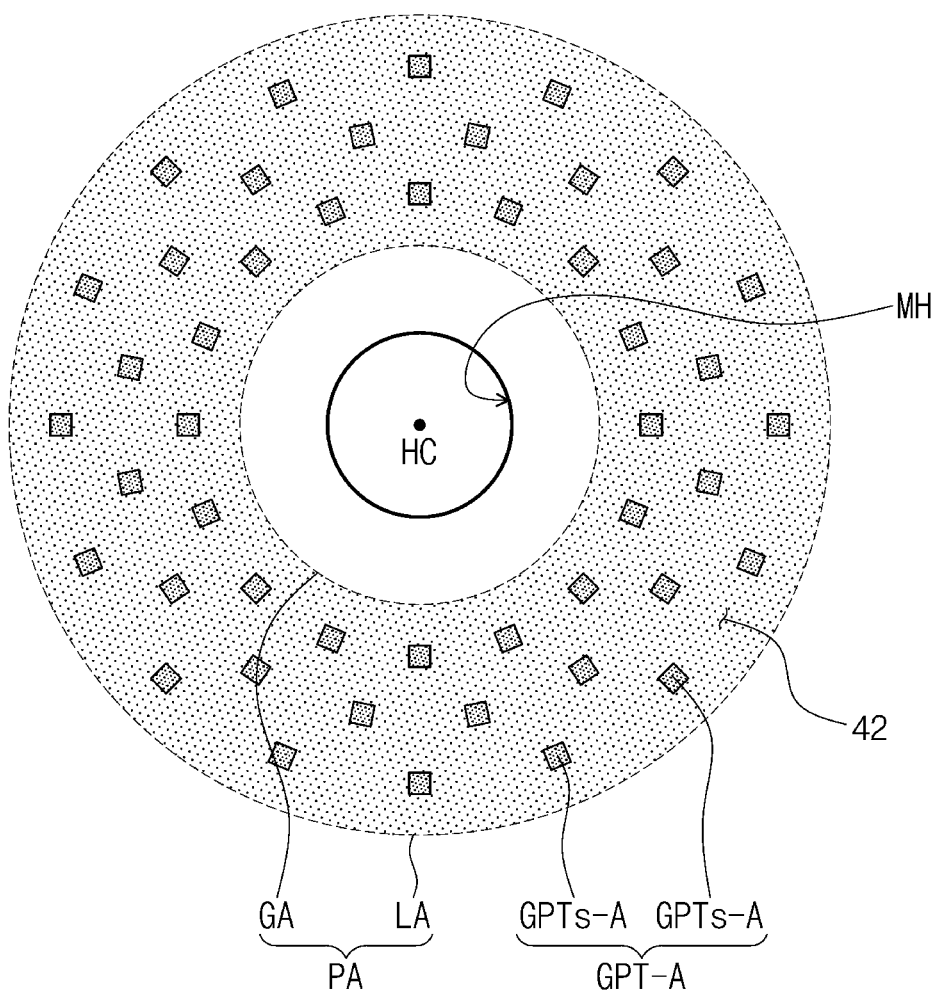
FIGS. 8A to 8D are schematic plan views illustrating partial areas of the display panels according to an alternative embodiment of the invention.

In an embodiment, as illustrated in FIG. 8A, a guide pattern GPT-A may be constituted by a plurality of island patterns GPTs-A spaced apart from each other. The island patterns GPTs-A may be spaced apart from each other on the line area LA. In such an embodiment, the island patterns GPTs-A may be randomly arranged. Thus, unlike the island patterns GPTs illustrated in FIG. 4B, the island patterns GPTs-A may be disposed to be distributed within the line area LA without division of columns or rows by using the module hole MH as a center HC.

Figure 8B:
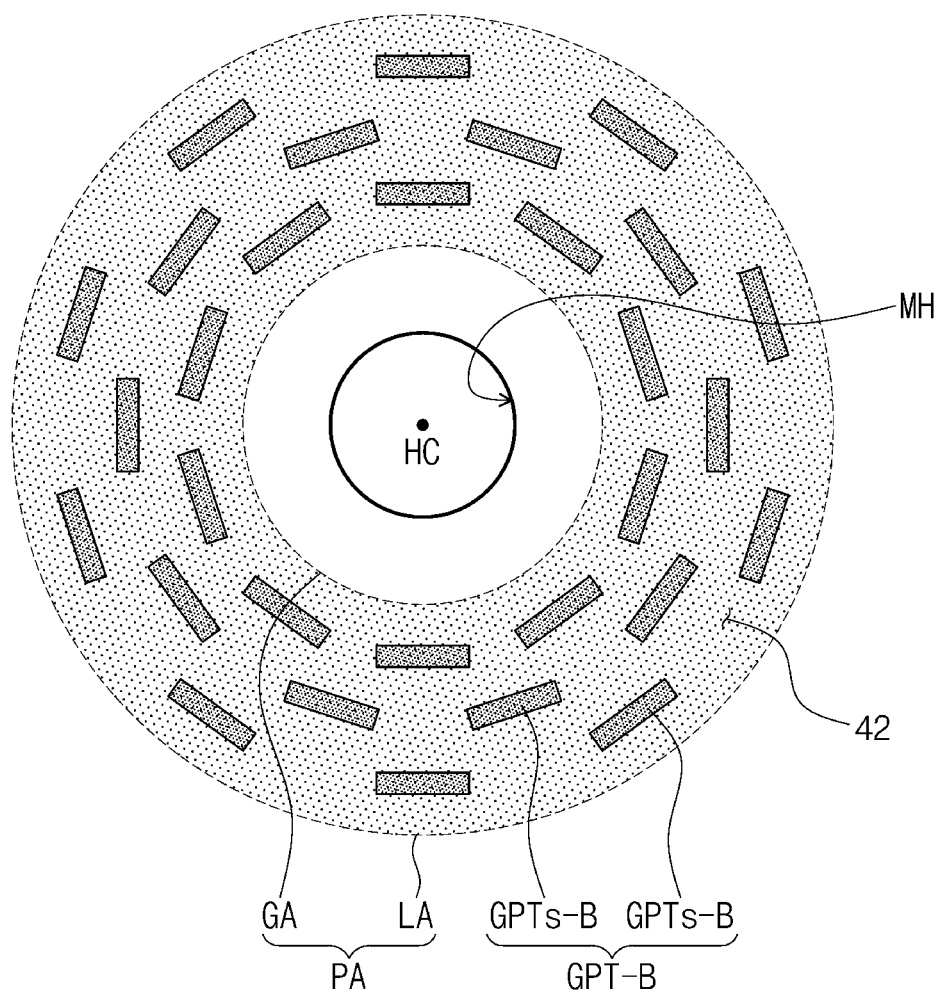

Alternatively, as illustrated in FIG. 8B, a guide pattern GPT-B may be constituted by a plurality of line patterns GPTs-B spaced apart from each other. Each of the line patterns GPTs-B may have a line shape extending in one direction. The line patterns GPTs-B may be arranged so that the extension direction of each of the line patterns GPTs-B are not limited to any one and face different directions.

In such an embodiment, the line patterns GPTs-B may be arranged so that the extension directions are disposed in a direction surrounding at least the module hole MH. Thus, one end of each of the line patterns GPTs-B may be disposed in a direction other than the center HC of the module hole MH. Thus, the line patterns GPTs-B may be disposed in a direction in which each of the extension directions crosses a direction in which the spreading of the organic layer 42 (see FIG. 5A) proceeds. Accordingly, overflowing of the organic layer 42 toward the module hole MH or excessive spreading of the organic layer 42 toward the groove area GA may be easily prevented.

Figure 8C:
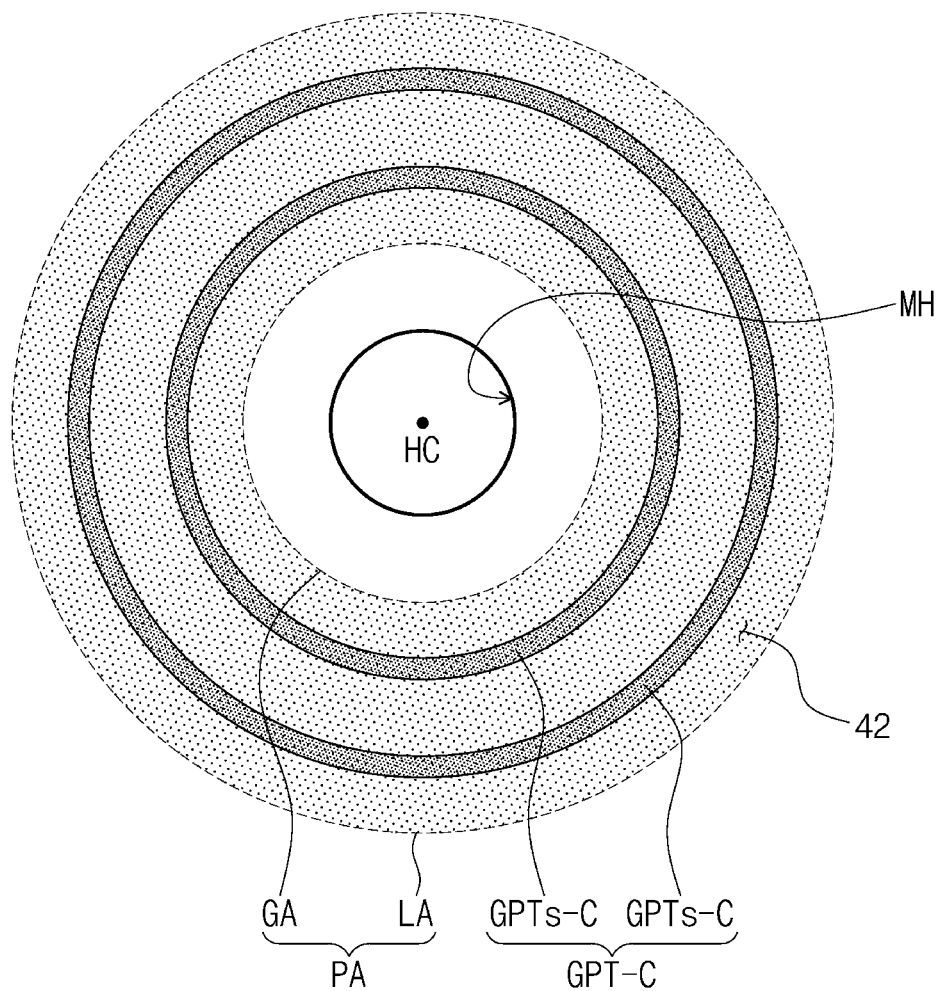

Alternatively, as illustrated in FIG. 8C, a guide pattern GPT-C may be constituted by closed line-shaped patterns GPTs-C spaced apart from each other. Each of the closed line-shaped patterns GPTs-C may surround the module hole MH. Each of the closed line-shaped patterns GPTs-C may have a circular shape corresponding to the module hole MH.

Figure 8D:
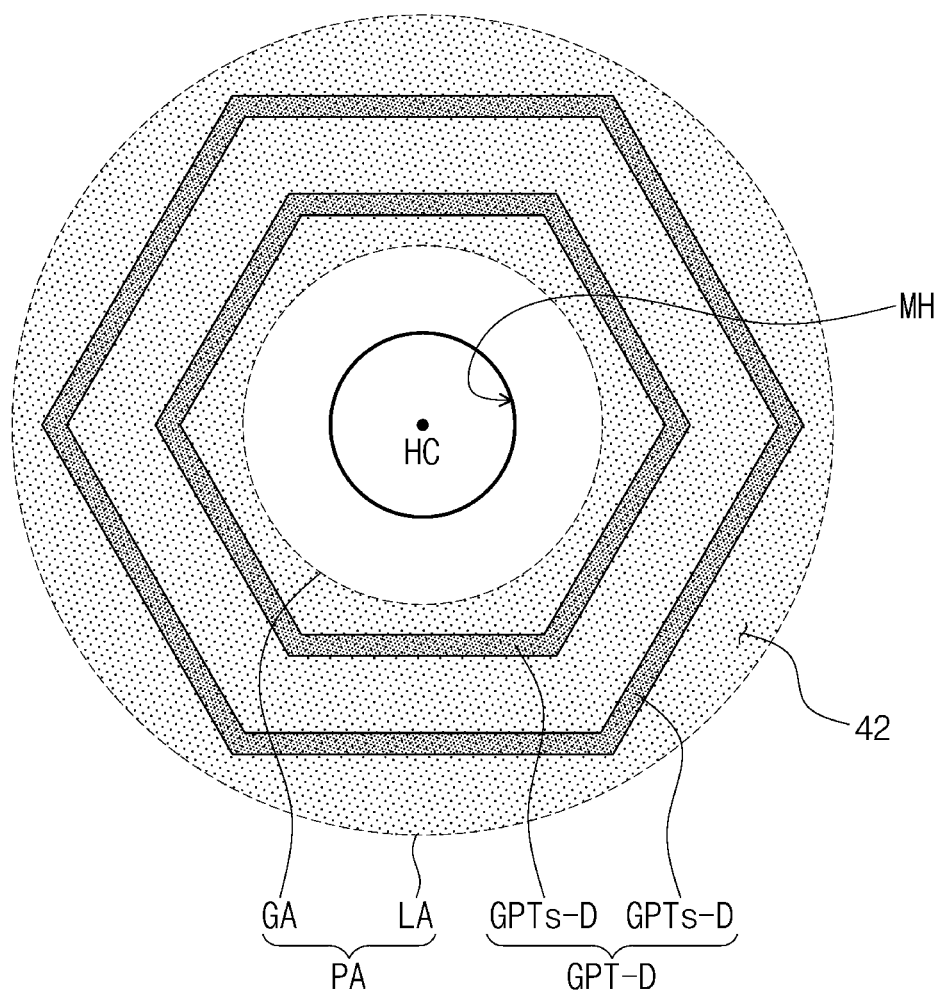

Alternatively, as illustrated in FIG. 8D, each of the closed line-shaped patterns GPTs-D constituting the guide pattern GPT-D may have a shape different from that of the module hole MH. In an embodiment, each of the closed line-shaped patterns GPTs-D may have a polygonal shape. In an embodiment, each of the closed line-shaped patterns GPTs-D may have a similar shape as each other. In one embodiment, for example, each of the closed line-shaped patterns GPTs-D has a hexagonal shape, as shown in FIG. 8D. However, this is merely an example. In one alternative embodiment, for example, the closed line-shaped to patterns GPTs-D may have different shapes from each other, but are not limited to any one embodiment.

Guide patterns GPT-C and GPT-D may be configured as a single closed line-shaped pattern or three or more closed line-shaped patterns, but are not limited to any one embodiment.

Figure 9A:
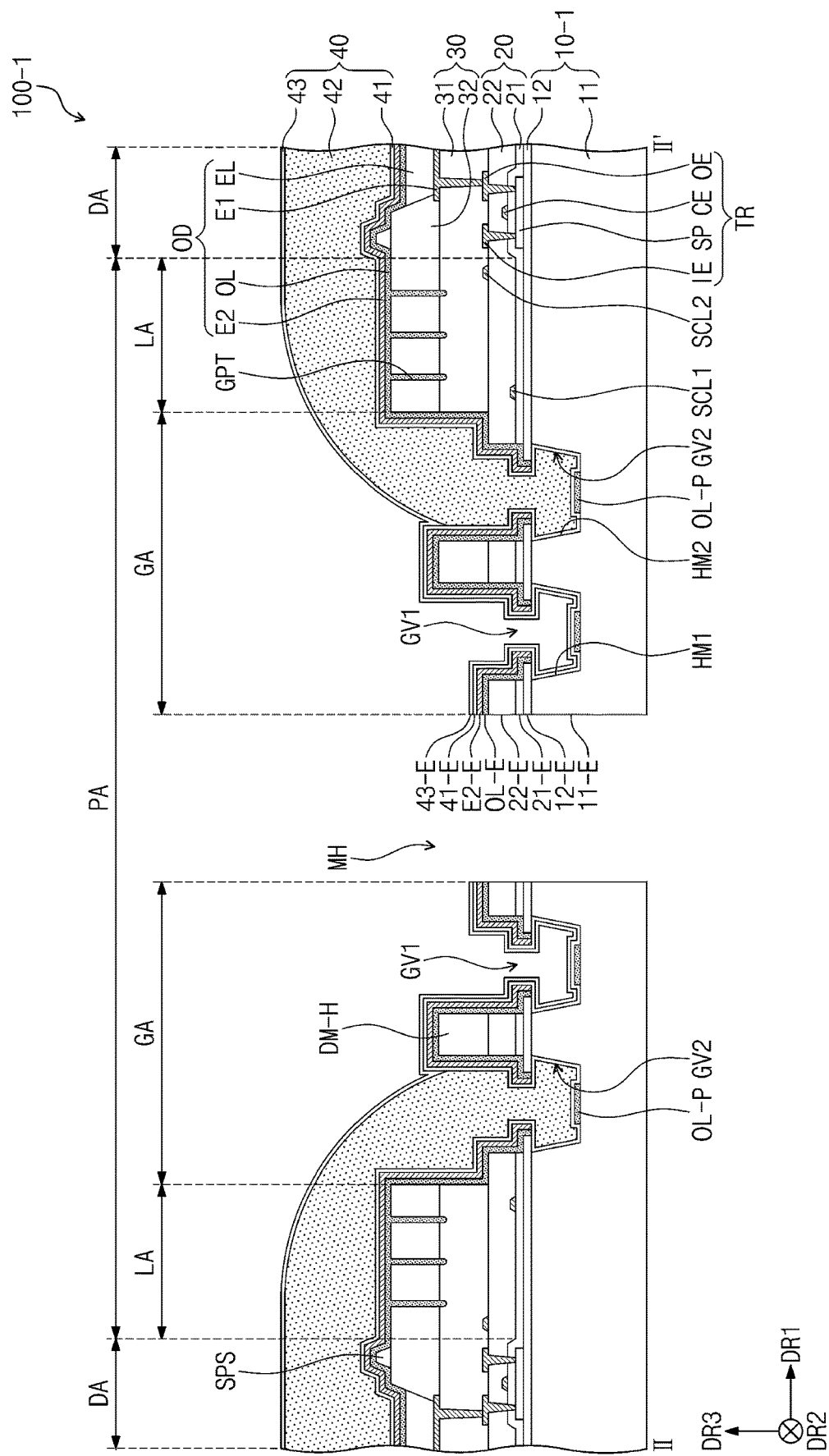
FIGS. 9A to 9C are cross-sectional views illustrating partial areas of the display panels according to an alternative embodiment of the invention.
Figure 9B:
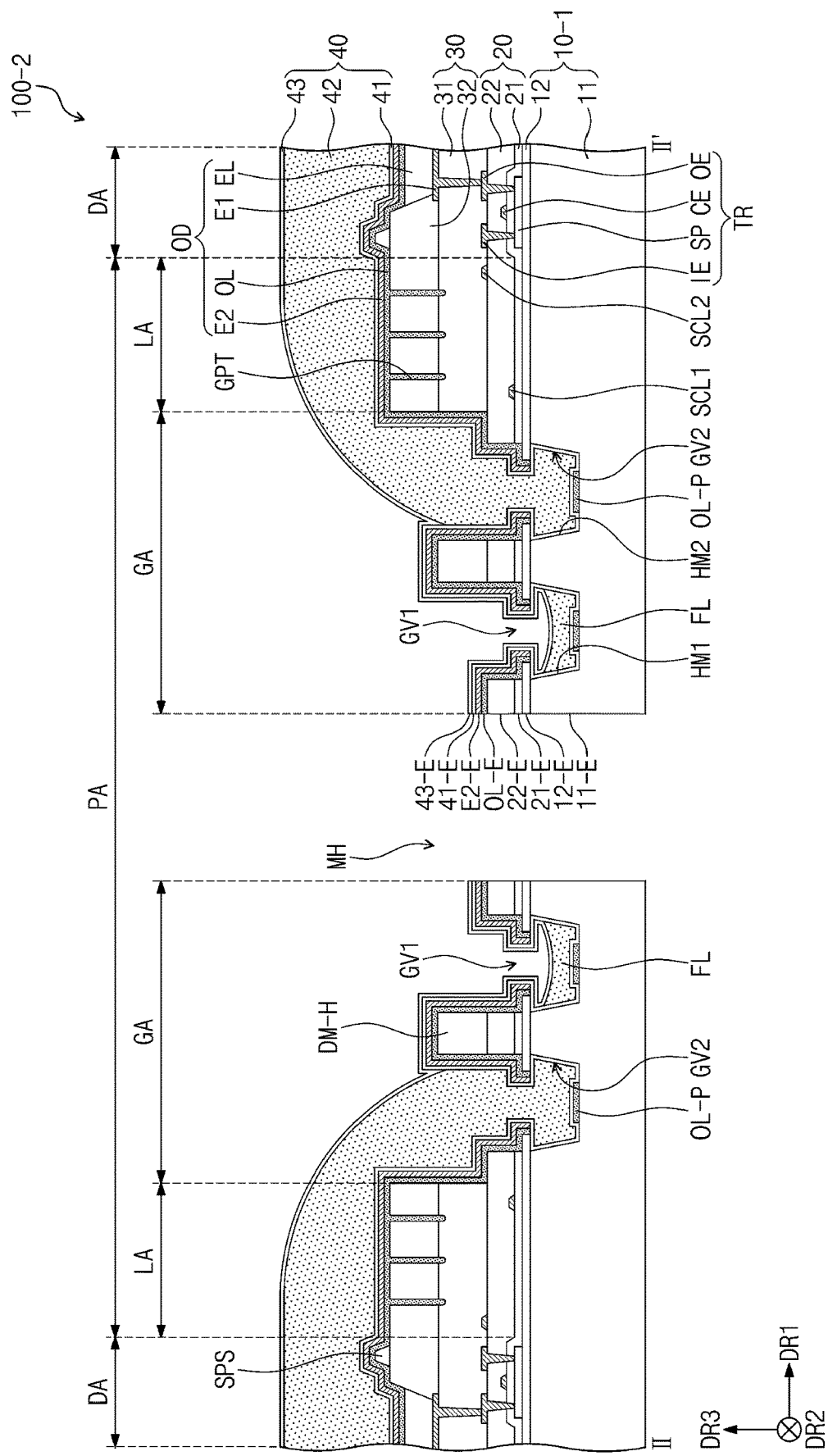
Figure 9C:
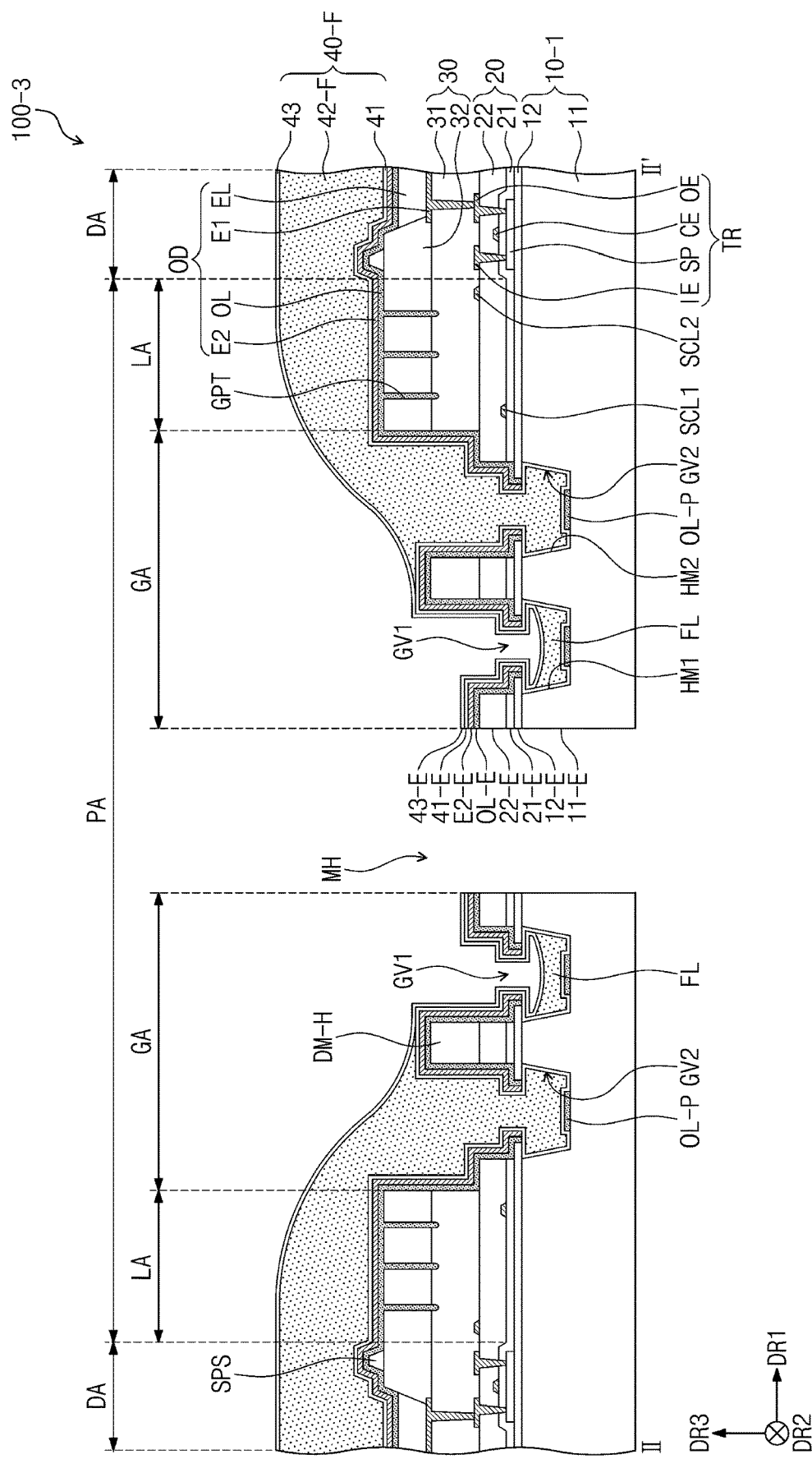

FIGS. 9A to 9C are cross-sectional views illustrating partial areas of the display panels according to an alternative embodiment of the invention. Hereinafter, alternative embodiments of the invention will be described with reference to FIGS. 9a to 9E. The same reference numeral may be given to components that are the same as those of FIGS. 1 to 8d, and any repetitive detailed descriptions thereof will be omitted.

In an embodiment, as illustrated in FIG. 9A, a display panel 100-1 may include a plurality of groove patterns GV1 and GV2. The groove patterns GV1 and GV2 may include a first groove pattern GV1 and a second groove pattern GV2, which are spaced apart from each other when viewed on the plane.

The first groove pattern GV1 surrounds the module hole MH. The first groove pattern GV1 may be a groove pattern closer to the module hole MH among the first and second groove patterns GV1 and GV2. The first groove pattern GV1 may correspond to a first groove part HM1 defined in a substrate 10-1. A recessed space of the first groove pattern GV1 may be provided by the first inorganic layer 41 and the second inorganic layer 43, which cover an inner surface of the first groove part HM1.

The second groove pattern GV2 surrounds the first groove pattern GV1. The second groove pattern GV2 may be a groove pattern closer to the active area DA among the first and second groove patterns GV1 and GV2. The second groove pattern GV2 may correspond to a second groove part HM2 defined in a substrate 10-1. The recessed space of the second groove pattern GV2 may be provided by the first inorganic layer 41 covering an inner surface of the second groove part HM2.

In an embodiment, the second groove pattern GV2 may be filled with the organic layer 42, and the first groove pattern GV1 may be exposed from the organic layer 42. When viewed on the plane, the organic layer 42 may overlap the second groove part HM2 and may be spaced apart from the first groove part HM1.

An embodiment of the display panel 100-1 according to the invention may further include a hole dam part DM-H (hereinafter, referred to as a dam part). The dam part DM-H may be disposed in the hole area PA and may be disposed between the first groove pattern GV1 and the second groove pattern GV2. The dam part DM-H may be disposed in a same layer as the first display insulating layer 31 or in a same layer as the second display insulating layer 32. The dam part DM-H may control the spreading of the organic layer 42 so that the organic layer 42 does not extend to the first groove pattern GV1.

Alternatively, as illustrated in FIG. 9B, a display panel 100-2 further includes a filling pattern FL disposed in the first groove pattern GV1 when compared to the display panel 100-1 illustrated in FIG. 9A. The filling pattern FL fills at least a portion of the first groove pattern GV1.

The filling pattern FL may be spaced apart from the organic layer 42. The filling pattern FL may be sealed by the first inorganic layer 41 and the second inorganic layer 43. The filling pattern FL may include the same material as the organic layer 42. Here, the filling pattern FL may be a pattern separated from the organic layer 42. That is, according to an embodiment of the invention, even if the dam part DM-H is provided in the display panel 100-2, a portion of the organic layer 42 may pass through the dam part DM-H and then be filled into the first groove pattern GV1.

Alternatively, as illustrated in FIG. 9C, in a display panel 100-3, a portion of the organic layer 42-F of the encapsulation layer 40-F may overlap the dam part DM-H. When fluidity and a dropping degree of the organic layer 42-F are large, a portion of the organic layer 42-F may be spread up to an area overlapping the dam part DM-H, and thus, at least a portion of the dam part DM-H may be covered by the organic layer 42-F.

This is merely an example. In one embodiment, for example, the filling pattern FL may include a material different from that of the organic layers 42 and 42-F. Embodiments of the display panels 100-1, 100-2, and 100-3 may be variously modified, but are not limited to any one embodiment.

FIGS. 10A to 10I are schematic cross-sectional views illustrating a method for manufacturing a display panel according to an embodiment of the invention. FIGS. 10A to 10I illustrate cross-sectional views in an area corresponding to the area illustrated in FIG. 5A for convenience of description. Hereinafter, an embodiment of the invention will be described with reference to FIGS. 10A to 10I. The same reference numeral may be given to components that are the same as those of FIGS. 1 to 9B, and any repetitive detailed descriptions thereof will be omitted.

Figure 10A:
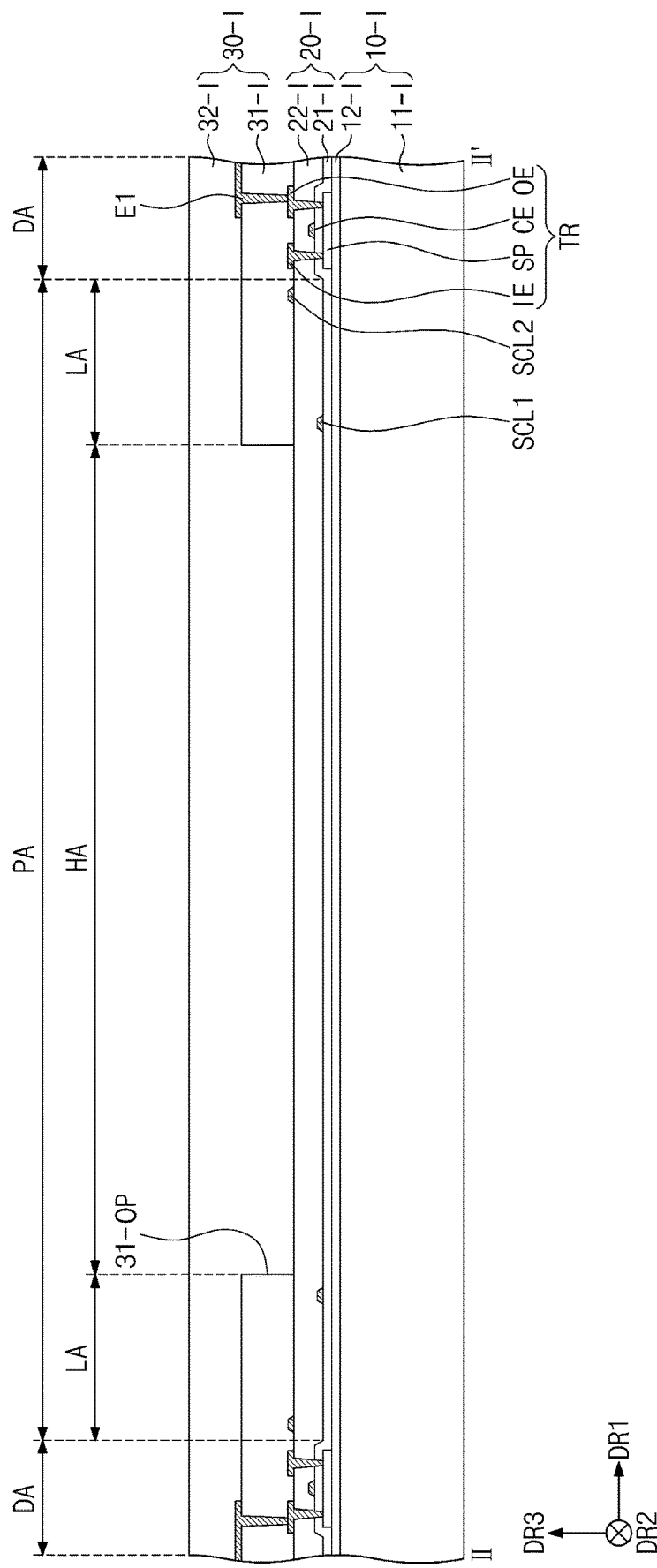
FIGS. 10A to 10I are schematic cross-sectional views illustrating a method for manufacturing a display panel according to an embodiment of the invention.

In an embodiment of a method for manufacturing a display panel, as illustrated in FIG. 10A, a preliminary insulating substrate 10-1, a preliminary circuit insulating layer 20-1, and a preliminary display layer 30-1 are provided or formed. The preliminary insulating substrate 10-1 may include a preliminary base layer 11-1 and a preliminary auxiliary layer 12-1 formed on the preliminary base layer 11-1. The preliminary auxiliary layer 12-1 may be formed by depositing an inorganic material on an entire surface of the preliminary base layer 11-1 to cover an active area DA and a hole area PA.

Before the preliminary display layer 30-1 is formed, a thin film transistor TR, a plurality of signal lines SCL1 and SCL2, a first preliminary circuit insulating layer 21-1, and a second preliminary circuit insulating layer 22-1 may be formed on the preliminary insulating substrate 10-I. The thin film transistor TR includes a semiconductor pattern SP formed by depositing/patterning a semiconductor material, and a control electrode CE, an input electrode IE, and an output electrode OE, which are respectively formed by depositing/patterning a conductive material.

The signal lines SCL1 and SCL2 may be formed by depositing/patterning a conductive material on the line area LA. Here, each of the signal lines SCL1 and SCL2 may be formed of the same material as each of the control electrode CE and the input electrode IE and may be simultaneously formed by the same process. However, this is merely an example. In one alternative embodiment, for example, the signal lines SCL1 and SCL2 may be formed through a process separated from the thin film transistor TR, but are not limited to any one embodiment. Each of the first preliminary circuit insulating layer 21-I and the second preliminary circuit insulating layer 22-I may be formed by depositing/patterning an insulating material.

The preliminary display layer 30-I is formed on the preliminary circuit insulating layer 20-I. The preliminary display layer 30-I may include a first preliminary display insulating layer 31-I and a second preliminary display insulating layer 32-I.

The first preliminary display insulating layer 31-I may be formed on the second preliminary circuit insulating layer 22. The first preliminary display insulating layer 31-I may be formed by depositing/patterning the insulating material. Here, the first preliminary display insulating layer 31-I may be patterned to form an opening 31-OP that covers the active area DA and the line area LA and opens an area corresponding to the preliminary hole area HA. However, this is merely an example. In one alternative embodiment, for example, the opening 31-OP in the first preliminary display insulating layer 31-I may be omitted, but is not limited to any one embodiment.

In an embodiment, the first electrode E1 may be formed on the first preliminary display insulating layer 31-I. A first electrode E2 may be formed by depositing/patterning a conductive material. The first electrode E1 may be connected to the thin film transistor TR by passing through the first preliminary display insulating layer 31-I. A through-portion or through-hole of the first preliminary display insulating layer 31-I, through which the first electrode E1 is disposed, may be formed simultaneously with the opening 31-OP. However, this is merely an example. In one embodiment, for example, the portion penetrated by the first electrode E1 may be formed in a process different from that of the opening 31-OP.

The second preliminary display insulating layer 32-I is formed on the first preliminary display insulating layer 31-I. The second preliminary display insulating layer 32-I may be formed on an entire surface of the insulating substrate 10 to cover the first electrode E1 and fill the opening 31-OP. The second preliminary display insulating layer 32-I may be formed by depositing an insulating material.

Figure 10B:
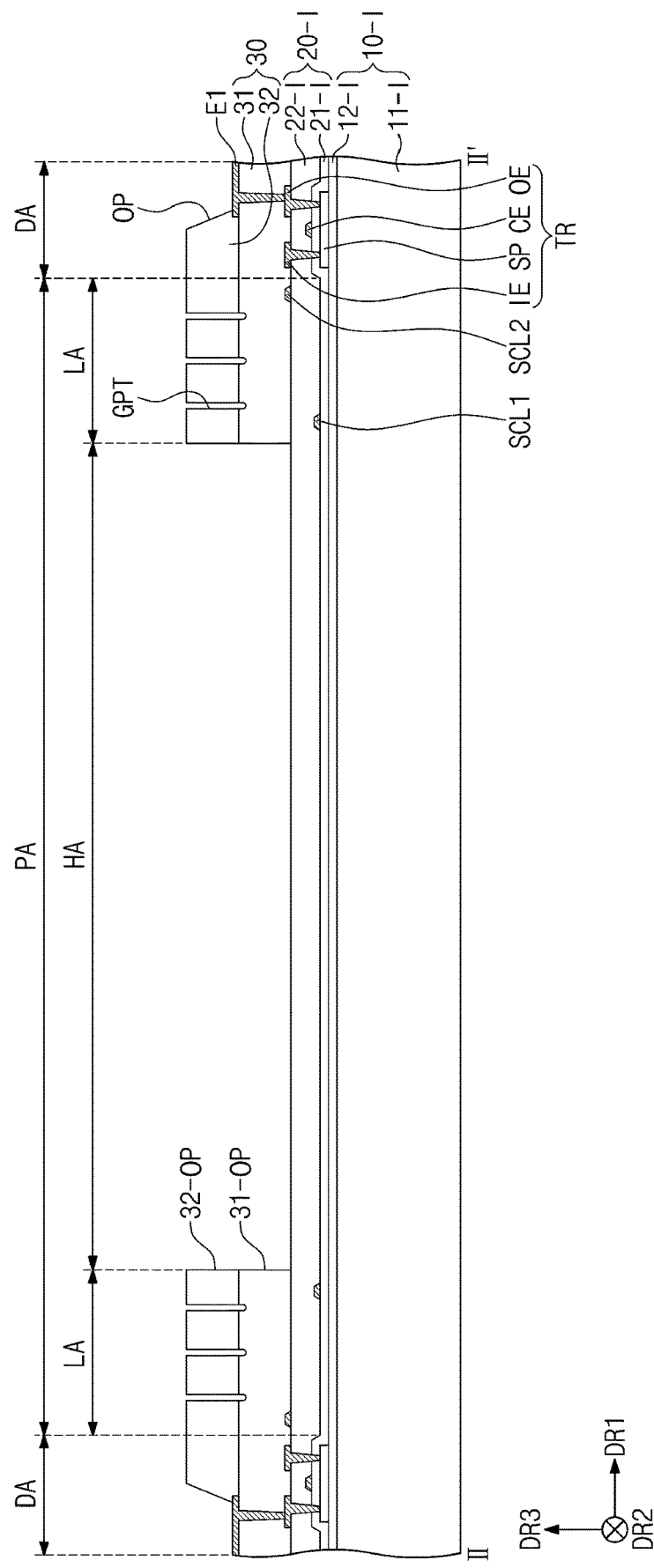

Thereafter, as illustrated in FIG. 10B, the display insulating layer 30 is formed by patterning the first preliminary display insulating layer 31-I. In this case, a pixel opening OP and a guide pattern GPT may be formed. The pixel opening OP is formed in the active area DA. The pixel opening OP may be formed by removing a portion of the first preliminary display insulating layer 31-I so that at least a portion of the first electrode E1 of the first preliminary display insulating layer 31-I is exposed. The pixel opening OP and the guide pattern GPT may be formed in the same process through one mask.

The guide pattern GPT is formed on the hole area PA. The guide pattern GPT may be formed on the line area LA by being spaced apart from the active area DA. The guide pattern GPT may be formed by removing at least a portion of the second preliminary display insulating layer 32-I.

Here, a depth of the guide pattern GPT may be determined according to a degree of etching of the second preliminary display insulating layer 32-I. In this embodiment, the guide pattern GPT may be formed to have a depth at which at least a portion of the first preliminary display insulating layer 31-I is removed. Thus, the guide pattern GPT is formed to have a depth corresponding to a thickness of the second preliminary display insulating layer 32-I passes, and a depth of the recessed portion of the first preliminary display insulating layer 31-I. However, this is merely an example. In one embodiment, for example, an etching rate or time of the second preliminary display insulating layer 32-I may be controlled to variously design the depth of the guide pattern GPT, but is not limited to any one embodiment.

When the second display insulating layer 32 is formed, an opening 32-OP that opens the preliminary hole area HA may be further formed. In an embodiment, the opening 31-OP of the first display insulating layer 31 and the opening 32-OP of the second display insulating layer 32 may be independently formed by different processes, but are limited thereto. Alternatively, the opening 31-OP of the first display insulating layer 31 and the opening 32-OP of the second display insulating layer 32 may be formed simultaneously by the same process, but are not limited to any one embodiment.

Figure 10C:
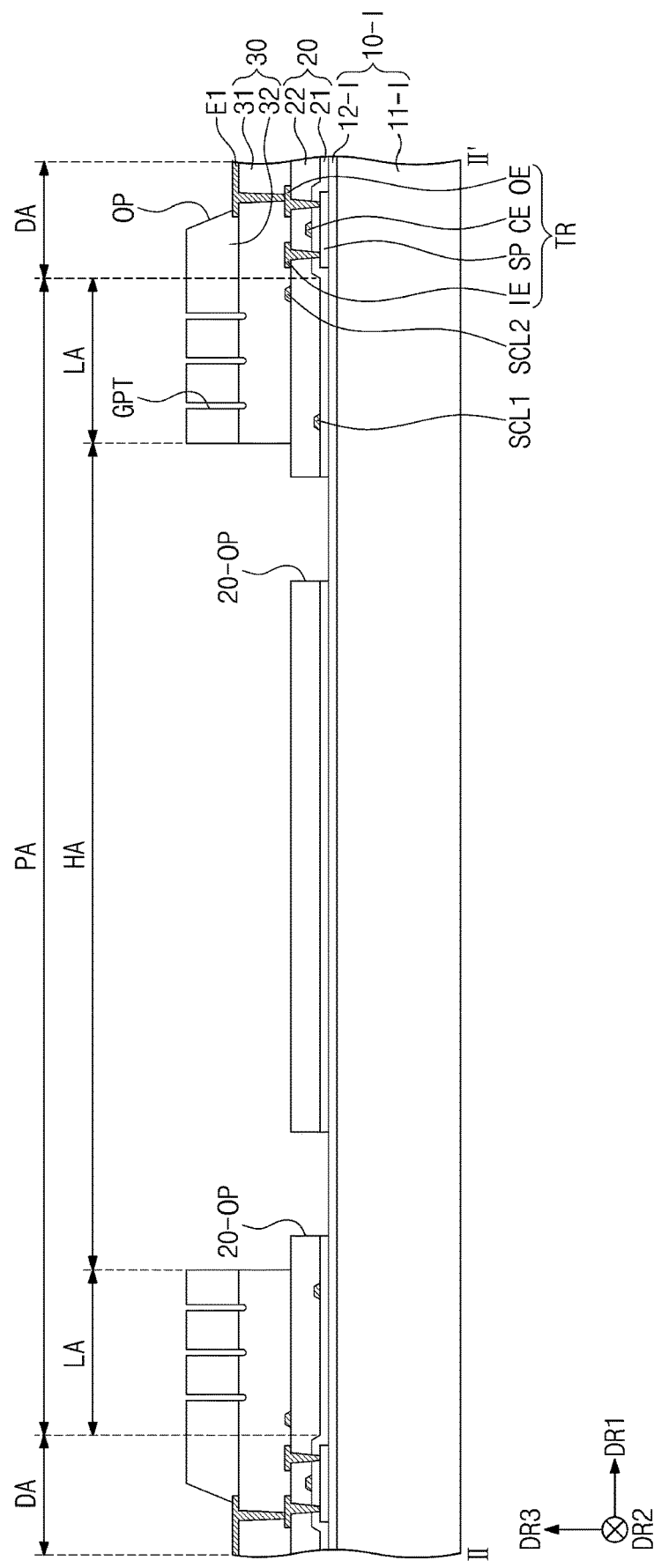

Thereafter, as illustrated in FIG. 10C, a circuit insulating layer 20 is formed by forming an opening 20-OP in the preliminary circuit insulating layer 20-I. The opening 20-OP is formed to pass through the first preliminary circuit insulating to layer 21-I and the second preliminary circuit insulating layer 22-I.

The opening 20-OP may be formed in the hole area HA. The opening 20-OP may correspond to an area in which a groove, which will be described later, is formed. Thus, it may be formed in a closed line shape surrounding a center of the preliminary hole area HA so as to surround the module hole described later.

Figure 10D:
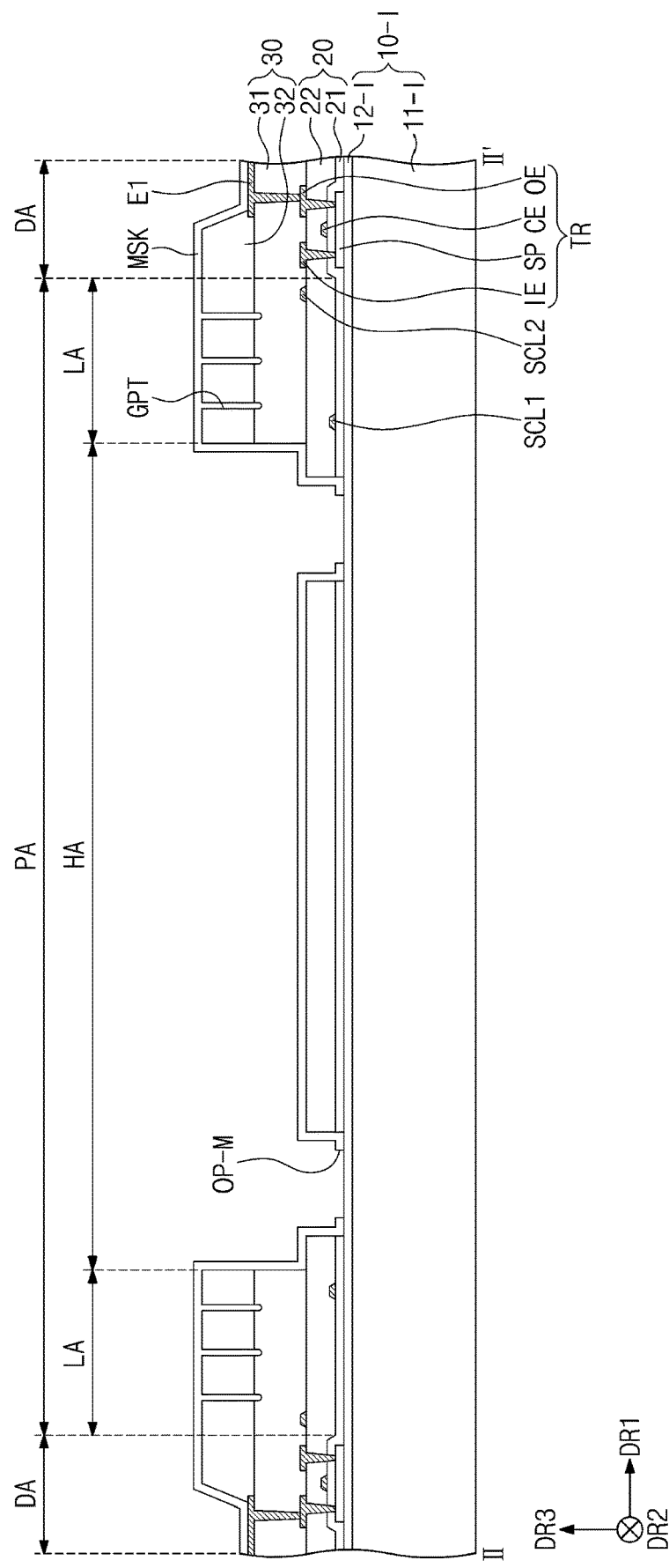

Thereafter, as illustrated in FIG. 10D, a mask MSK, in which a predetermined open portion OP-M is formed, is formed. The mask MSK may be formed on the display insulating layer 30 and the circuit insulating layer 20. The mask MSK may be formed by depositing/patterning an inorganic material. In one embodiment, for example, the mask MSK may include or be formed of a metal or metal oxide. The open portion OP-M of the mask is formed in an area overlapping the opening 20-OP formed in the circuit insulating layer 20 to expose a portion of the entire surface of the preliminary insulating substrate 10-I.

Figure 10E:
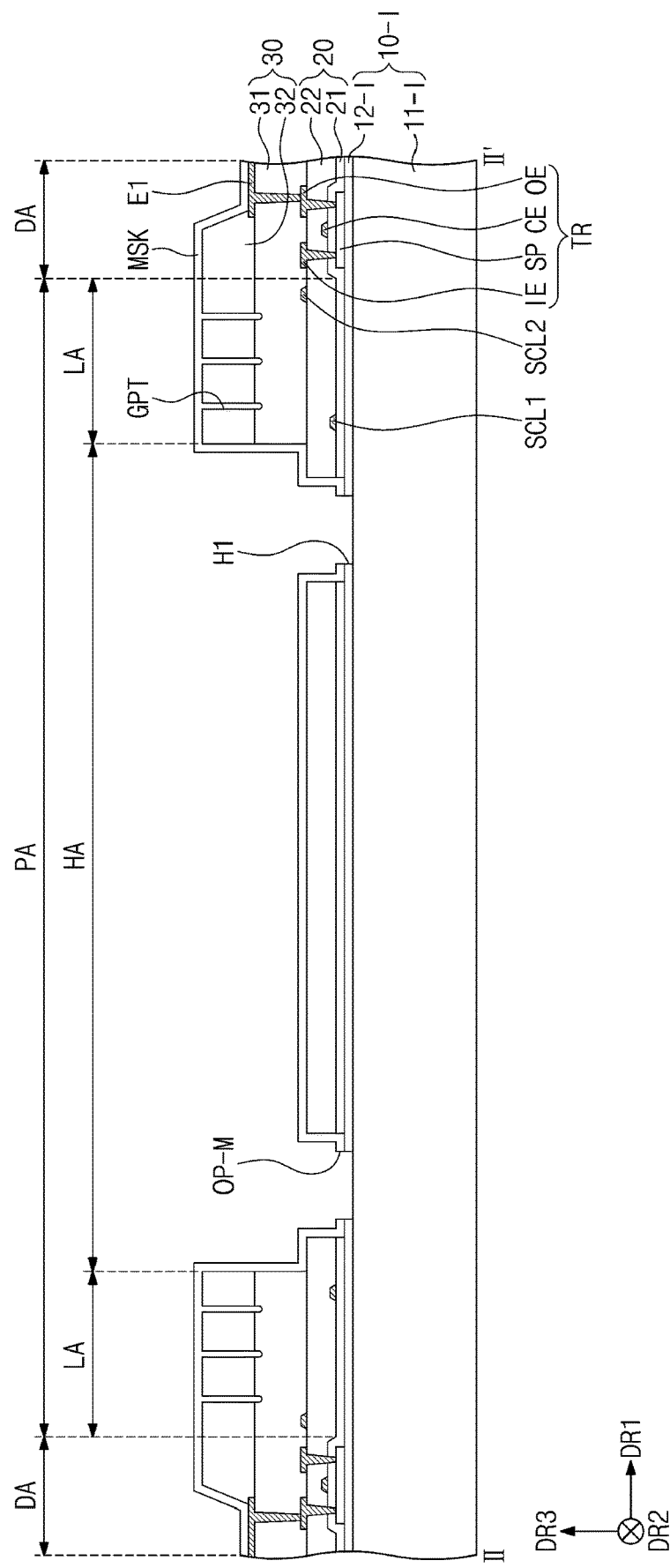

Thereafter, as illustrated in FIG. 10E, an auxiliary layer 12 is formed by etching the preliminary auxiliary layer 12-I using the mask MSK. A portion of the preliminary auxiliary layer 12-I, which is exposed by the open portion OP-M of the mask, is etched to form a first portion H1. The first portion H1 exposes a top surface of the preliminary base layer 11-1.

Figure 10F:
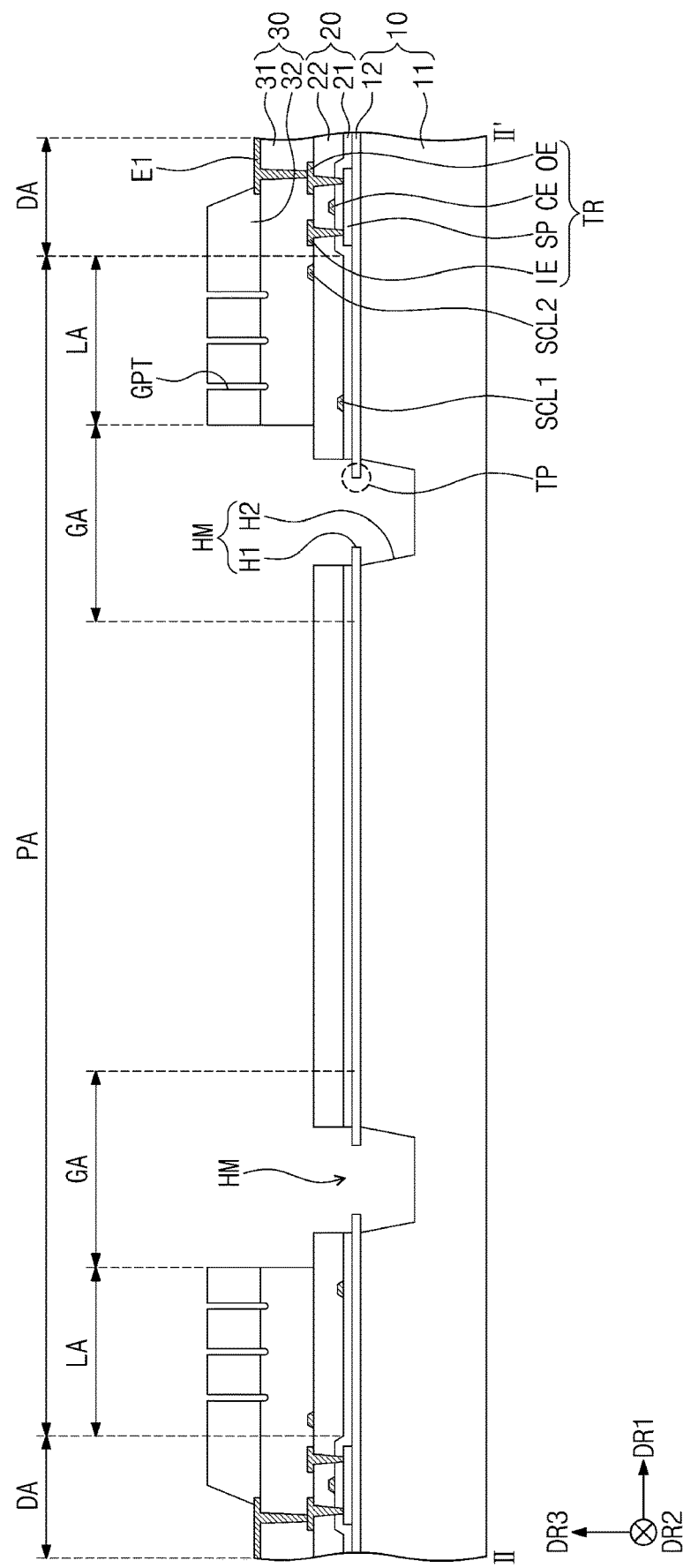

Thereafter, as illustrated in FIG. 10F, the insulating substrate 10 is formed by additionally etching the preliminary base layer 11-1 using the mask MSK. Due to a difference in etch selectivity between the preliminary base layer 11-1 and the preliminary auxiliary layer 12-I, the preliminary base layer 11-1 includes a second portion H2 that is under-cut from the open portion OP-M of the mask or the first portion H1. A width of the first portion H1 in the second direction DR2 may be less than that in the second direction D2 at the uppermost side of the second portion H2. The auxiliary layer 12 may be formed with a tip part TP protruding by the under-cut. Thus, the groove part HM may include the first portion H1 and the second portion H2 and thus may include the tip part TP with the undercut shape.

Figure 10G:
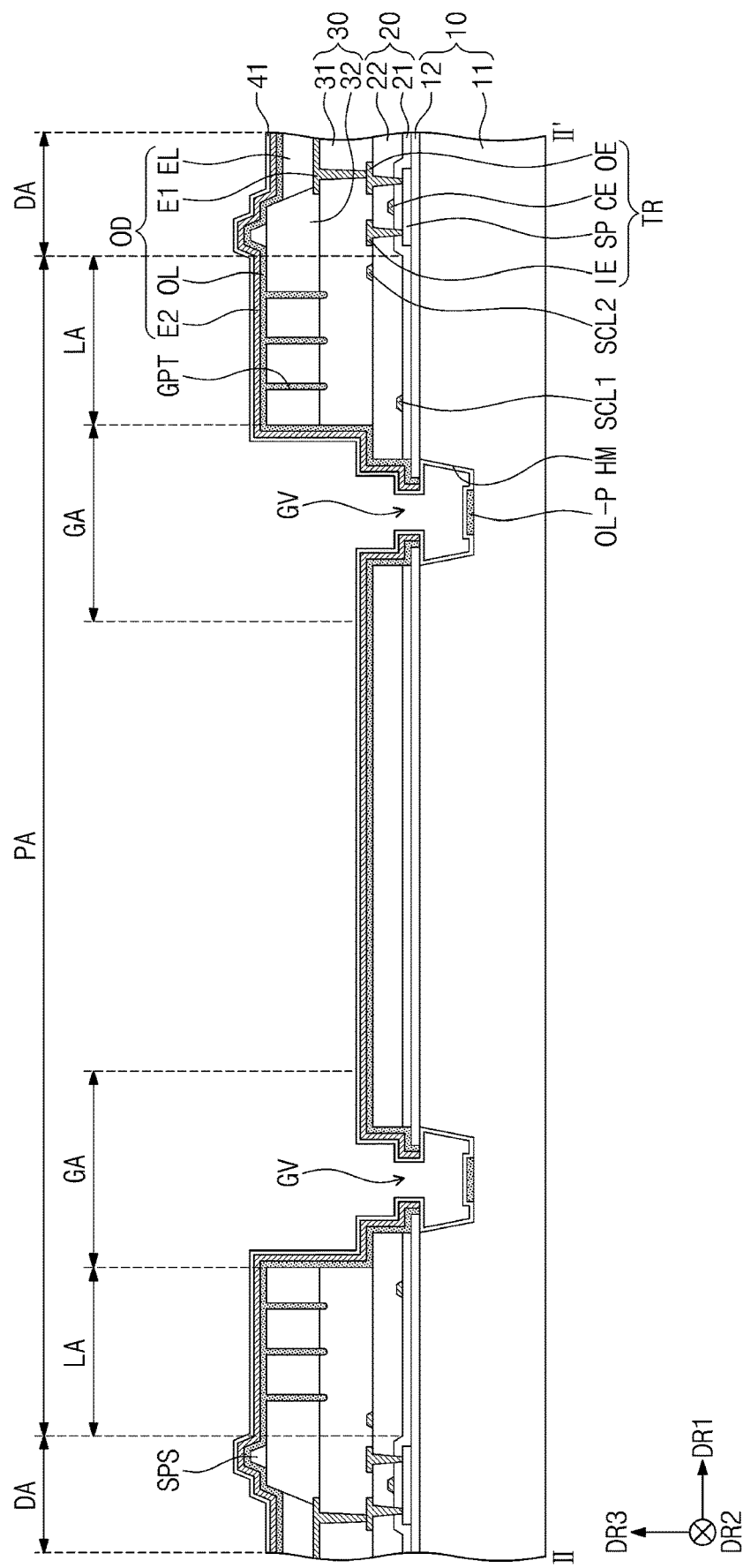

Thereafter, as illustrated in FIG. 10G, the light emitting element OD and the first inorganic layer 41 are formed. The light emitting element OD may be formed by sequentially forming the emission layer EL, the control layer OL, and the second electrode E2. The emission layer EL may be formed by printing or jetting a light emitting material into the opening OP through the mask supported by the spacer SPS formed on the top surface of the second display insulating layer 32.

The control layer OL may be formed by depositing an organic material. The control layer OL may be formed by thermal deposition (i.e., evaporation). Here, a portion of the organic material may be deposited in the groove part HM to form an organic pattern OL-P. The second electrode E2 may be formed by depositing a conductive material. The deposition of the second electrode E2 may include a physical deposition process including thermal deposition and sputtering. Thus, although not shown, a portion of the conductive material may be formed in the groove part HM during the deposition process of the second electrode E2 to form a pattern.

The first inorganic layer 41 may be formed on the active area DA and the hole area PA. The first inorganic layer 41 may be formed by depositing an insulation material. In one embodiment, for example, the first inorganic layer 41 may be formed by depositing an inorganic material or formed through chemical vapor deposition. Here, the first inorganic layer 41 may be formed along an inner surface of the groove part HM.

Figure 10H:
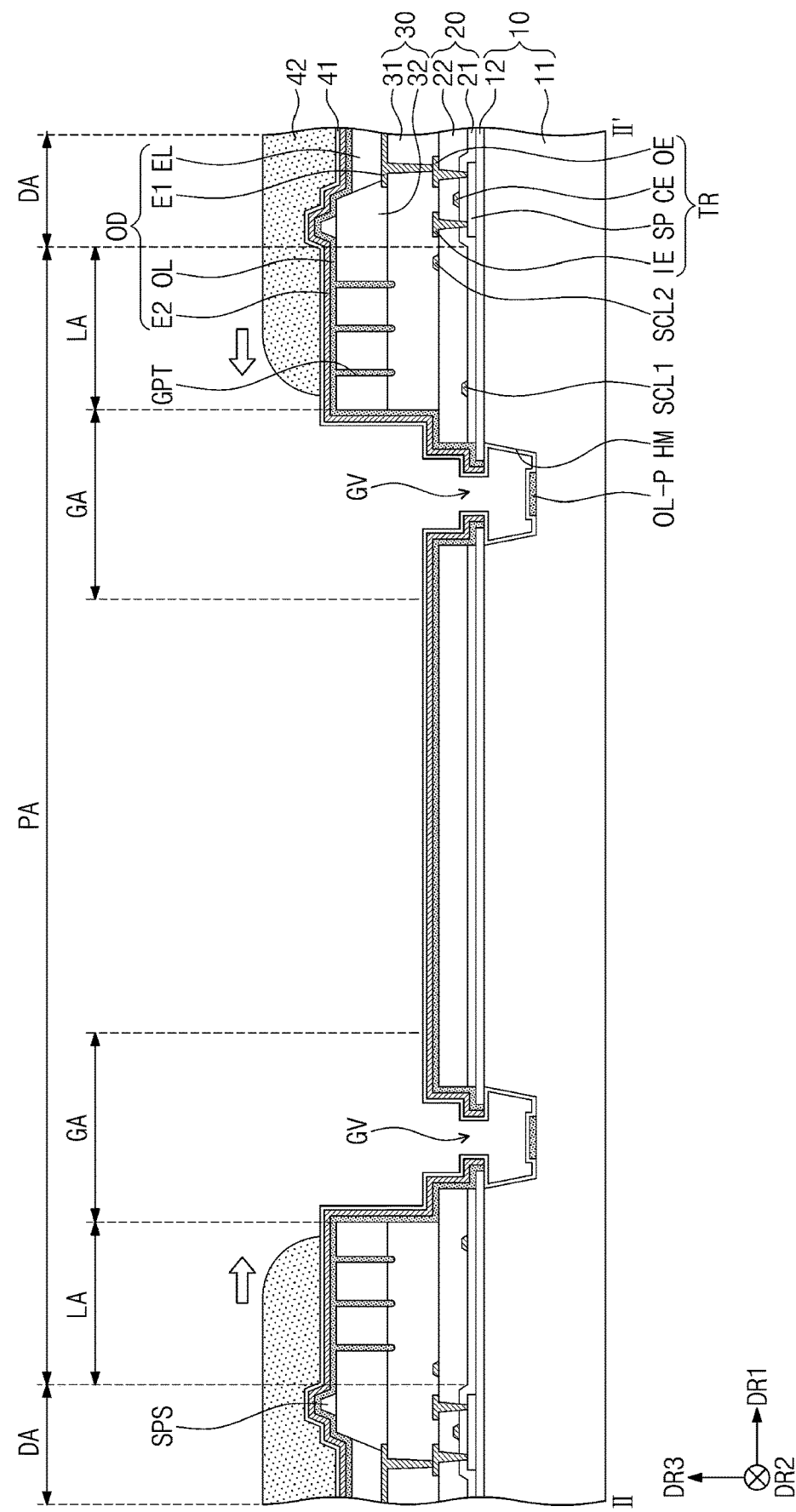

Thereafter, as illustrated in FIG. 10H, an organic layer 42 is formed on the active area DA. The organic layer 42 may be formed by applying a liquid organic material to the first inorganic layer 41 through a solution process such as a screen printing process or an inkjet process.

In an embodiment, the organic layer 42 is formed by dropping a liquid organic material onto the active area DA and controlling the spreading of the dropped organic material. Here, the dropped organic material may be spread from the active area DA toward the hole area PA in a direction of an arrow to come into contact with the guide pattern GPT. The dropped organic material may fill at least a portion of the guide pattern GPT, or the spread path may be controlled by the guide pattern GPT so that the dropped organic material is evenly spread over an entire surface of the line area LA. Thus, the guide pattern GPT may be further provided to stably design the area one which the organic layer 42 is formed.

Figure 10I:
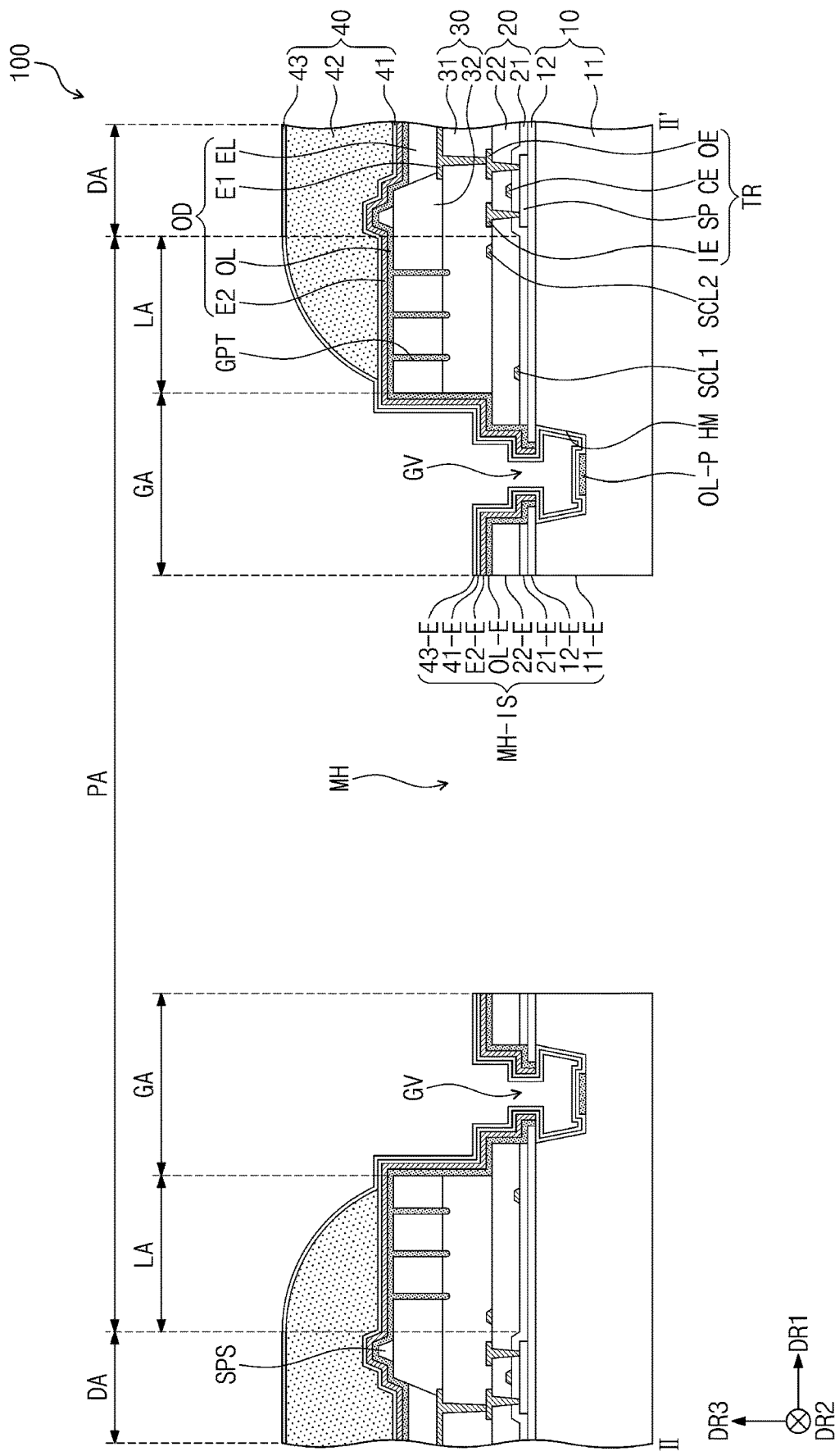

Thereafter, as illustrated in FIG. 10I, after the second inorganic layer 43 is formed, a module hole MH is formed to form the display panel 100. The second inorganic layer 43 may be formed by depositing an insulation material. In one embodiment, for example, the second inorganic layer 43 may be formed by depositing an inorganic material on the organic layer 42 through chemical vapor deposition. The second inorganic layer 43 may be formed along the inside of the groove part HM to form a groove pattern GV. The second inorganic layer 43 may be formed to contact the first inorganic layer 41, and the organic layer 42 may be sealed by the first inorganic layer 41 and the second inorganic layer 43.

Thereafter, the module hole MH is formed in the hole area PA. The module hole MH may be formed to pass through the display panel 100. The base layer 11, the auxiliary layer 12, the first circuit insulating layer 21, the second circuit insulating layer 22, the first display insulating layer 31, the second display insulating layer 32, the control layer OL, the second electrode E2, the first inorganic layer 41, and the second inorganic layer 43, which are disposed in the hold area PA, may be penetrated by laser or drilling. Thus, a cross-section 11-E of the base layer, a cross-section 12-E of the auxiliary layer, a cross-section 21-E of the first circuit insulating layer, a cross-section 22-E of the second circuit insulating layer, a cross-section 31-E of the first display insulating layer, the cross-section 32-E of the second display insulating layer, a cross-section OL-E of the control layer, a second electrode E2-E of the second electrode, a cross-section 41-E of the first inorganic layer, and a cross section 43-E of the second inorganic layer may be formed, and an inner surface of the module hole MH may be defined by the above-described cross-sections.

FIGS. 11A to 11F are cross-sectional views illustrating a method of manufacturing a display panel according to an alternative embodiment of the invention. FIGS. 11A to 11F illustrate cross-sectional views in an area corresponding to the area illustrated in FIG. 5A for convenience of description. Hereinafter, the invention will be described with reference to FIGS. 11A and 11B. The same reference numeral may be given to components that are the same as those of FIGS. 1 to 10I, and any repetitive detailed descriptions thereof will be omitted.

Figure 11A:
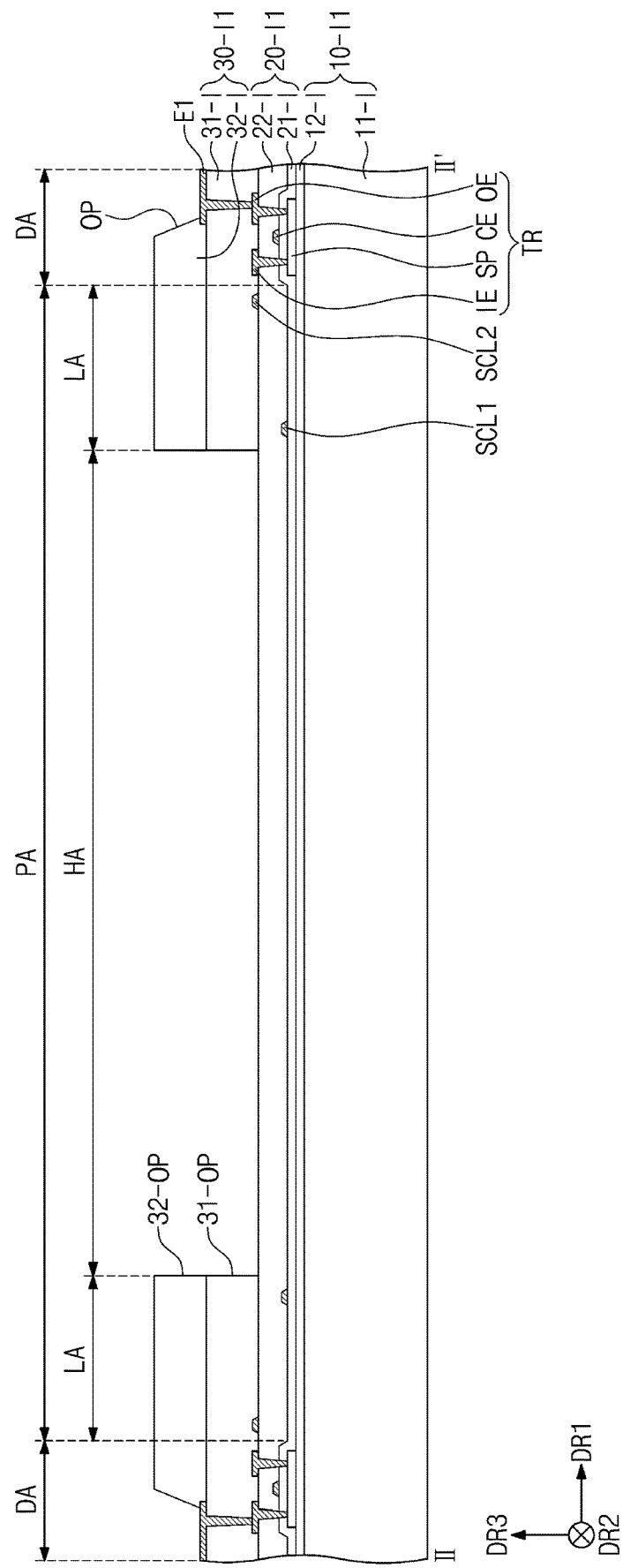
FIGS. 11A to 11F are cross-sectional views illustrating a method of manufacturing a display panel according to an alternative embodiment of the invention.

In an alternative embodiment of a method of manufacturing a display panel, as illustrated in FIG. 11A, a preliminary insulating substrate 10-11, a preliminary circuit insulating layer 20-11, and a preliminary display insulating layer 30-11 are provided or formed. Since the preliminary insulating substrate 10-11 and the preliminary circuit insulating layer 20-11 correspond to those described with reference to FIG. 10A, any repetitive detailed descriptions thereof will be omitted. An opening OP exposing a first electrode E1 and an opening 32-OP exposing a preliminary hole area HA may be formed in the preliminary display insulating layer 30-11. Here, unlike FIG. 10B, the guide pattern GPT (see FIG. 10B) is not formed on the preliminary display insulating layer 30-11.

Figure 11B:
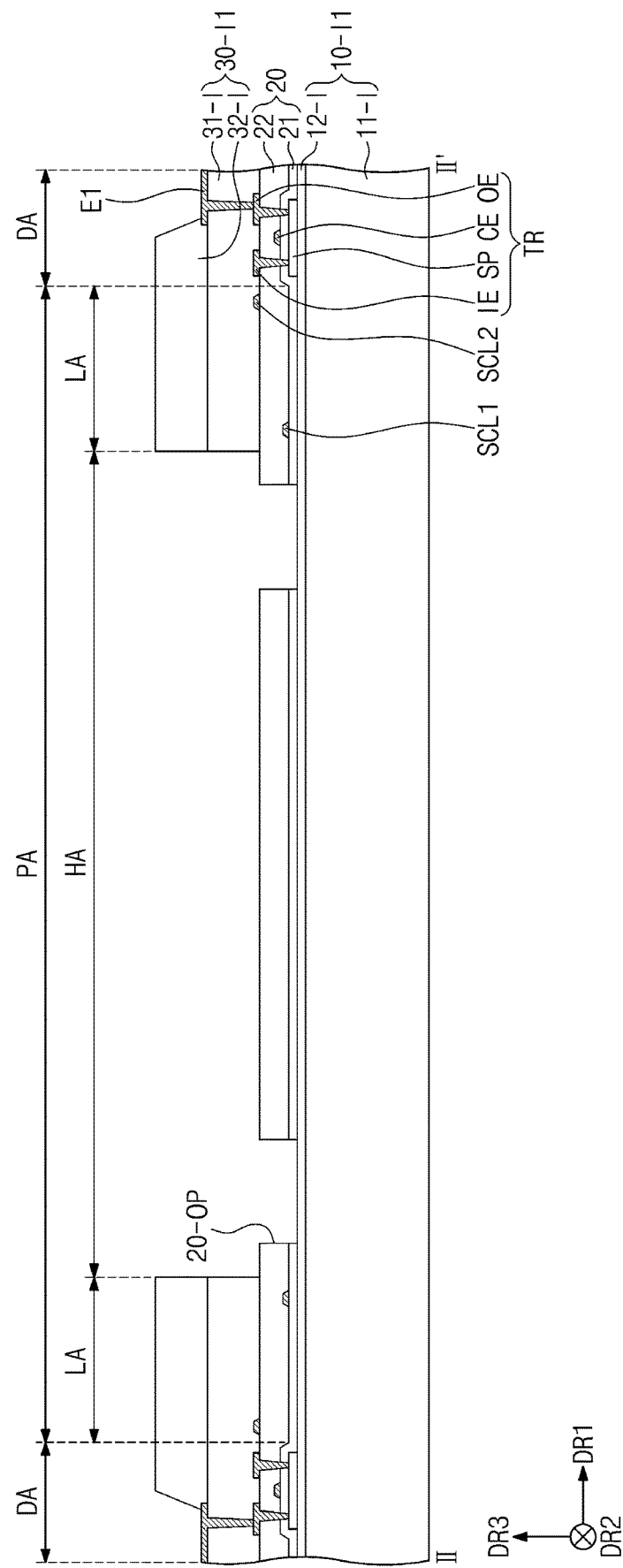

Thereafter, as illustrated in FIG. 11B, a circuit insulating layer 20 is formed by forming an opening 20-OP in the preliminary circuit insulating layer 20-11. An opening 20-OP of the preliminary circuit insulating layer may be formed in the preliminary hole area HA and corresponds to those described in FIG. 10O, and thus, any repetitive detailed description will be omitted.

Figure 11C:
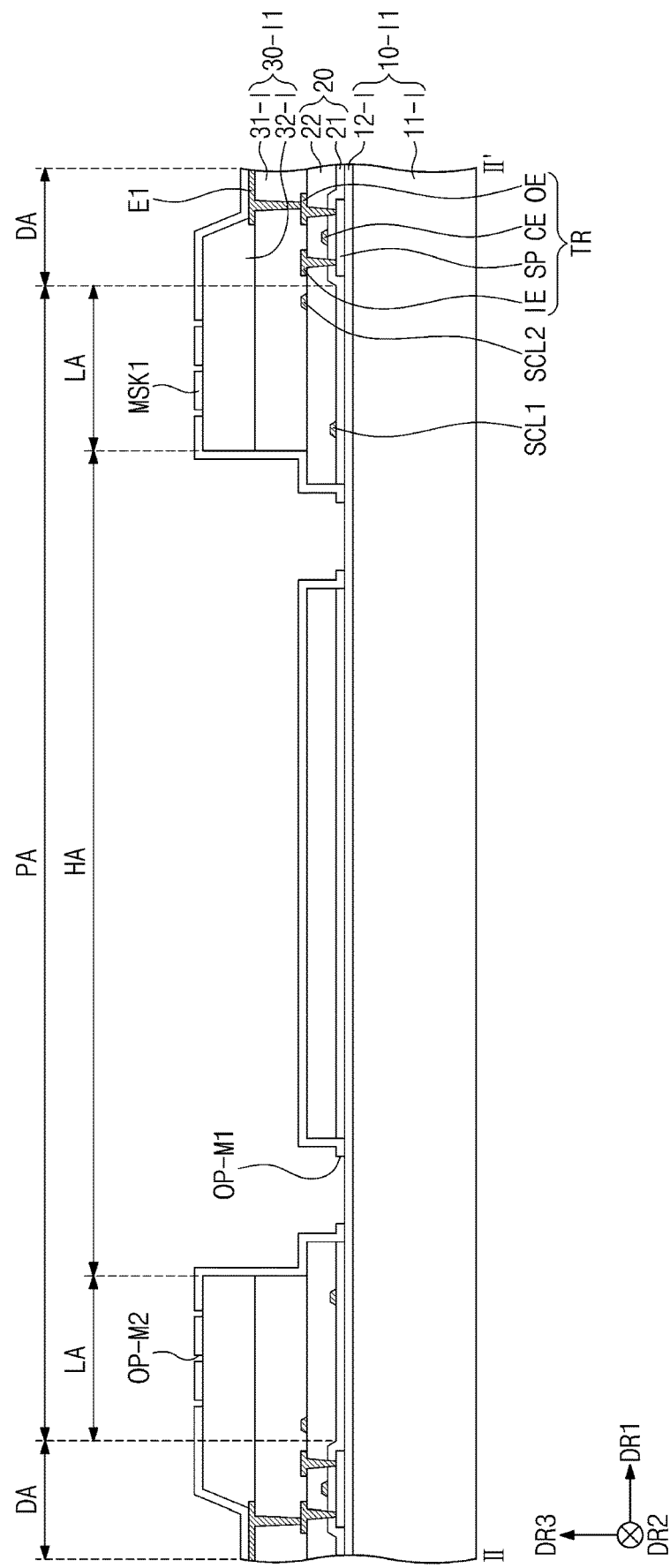

Thereafter, as illustrated in FIG. 11C, a mask MSK1 is formed on the preliminary insulating substrate 10-11. The mask MSK1 may be formed to overlap the hole area PA and the active area DA and may be formed by depositing/patterning an inorganic material. In an embodiment, the mask MSK1 may be made of metal oxide.

The mask MSK1 may include a first open part OP-M1 formed in the preliminary hole area HA and a second open part OP-M2 formed in the line area LA. Since the first open part OP-M1 is a portion for forming the groove part HM and corresponds to the open part OP-M (see FIG. 10D) illustrated in FIG. 10D, any repetitive detailed description thereof will be omitted below. The second open part OP-M2 is disposed in the preliminary display insulating layer 30-11 to expose at least a portion of a top surface of the second preliminary display insulating layer 32-11.

Figure 11D:
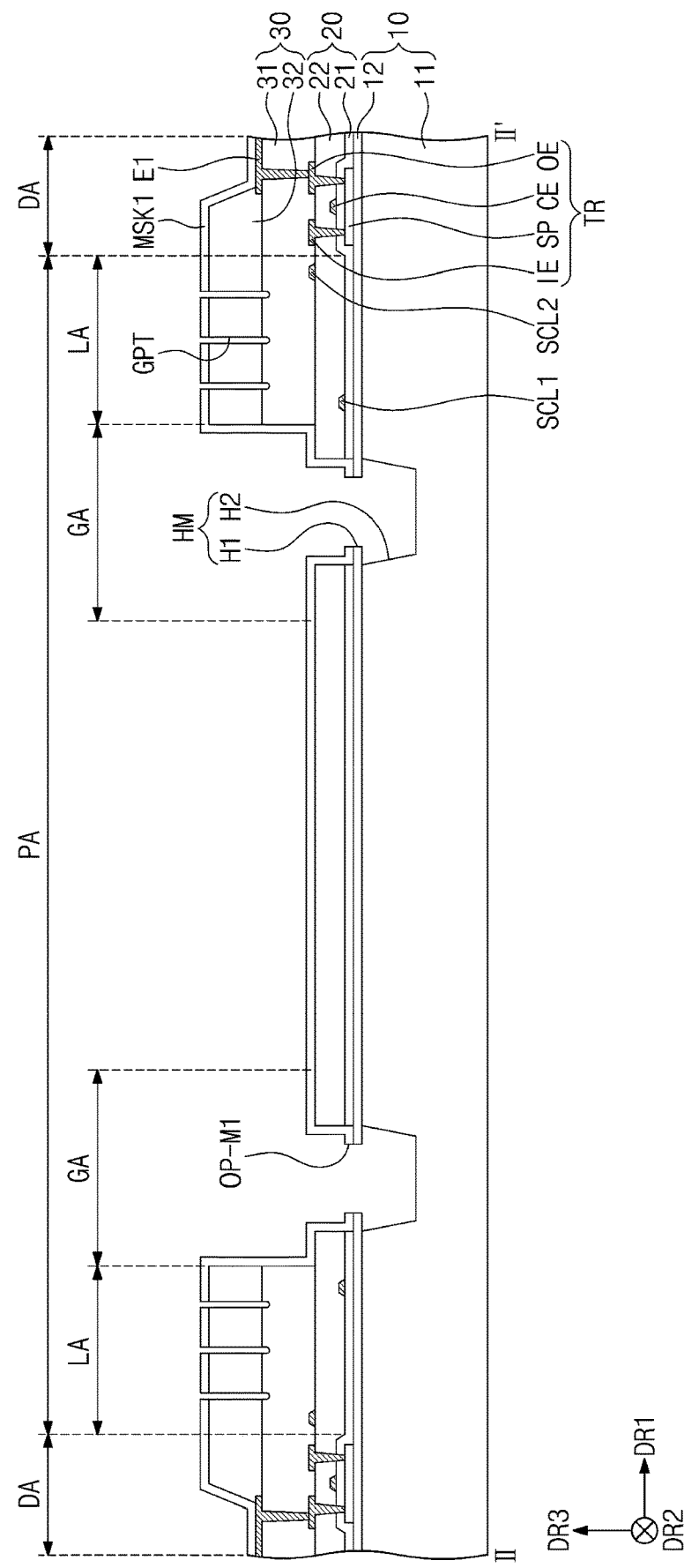

Thereafter, as illustrated in FIG. 11D, the preliminary insulating substrate 10-11 and the preliminary display insulating layer 30-11 are etched through the mask MSK1 to form the display insulating layer 30. Here, the groove part HM and the guide pattern GPT may be formed. In an embodiment, the groove part HM and the guide pattern GPT may be formed in the same process through one mask MSK1. A depth of the guide pattern GPT and a depth of the groove HM may be variously controlled by controlling an etching rate and time of the preliminary display insulating layer 30-11.

Figure 11E:
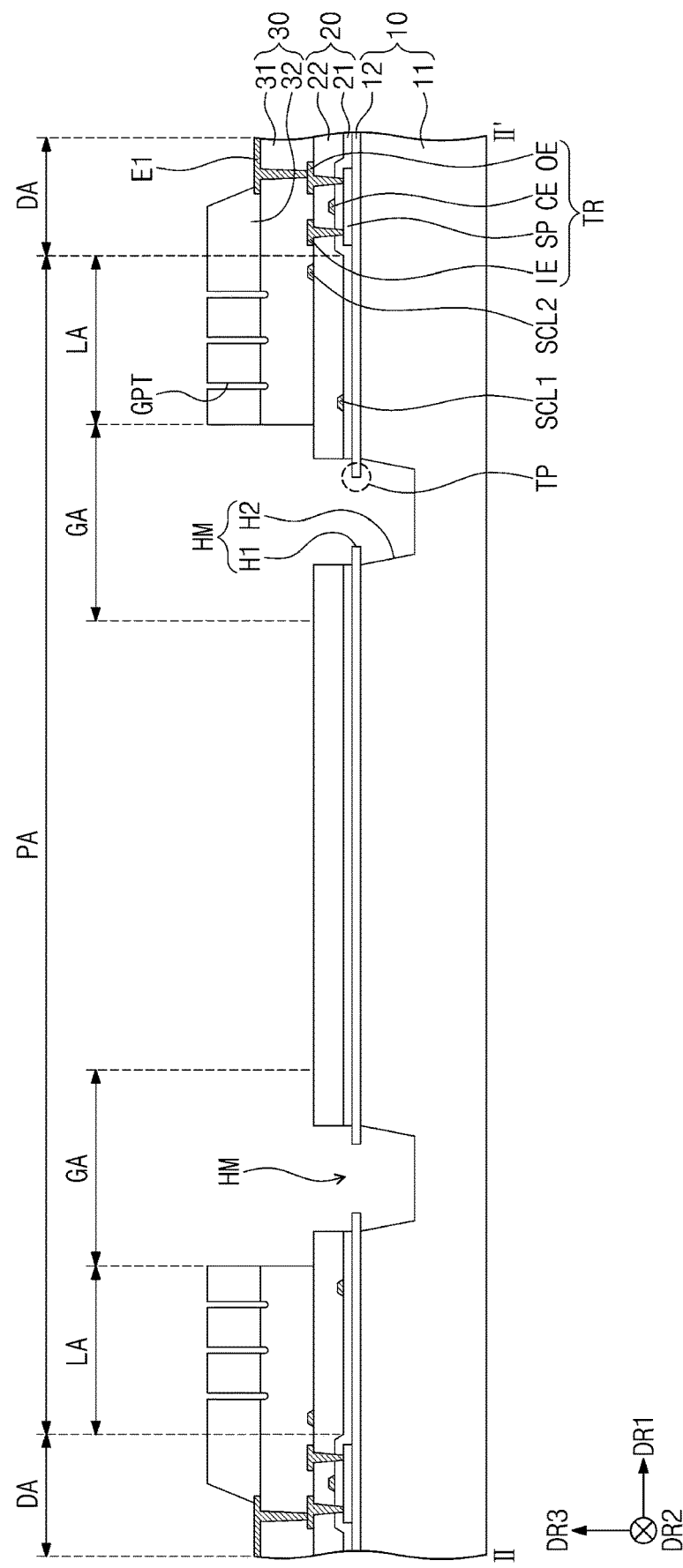
Figure 11F:
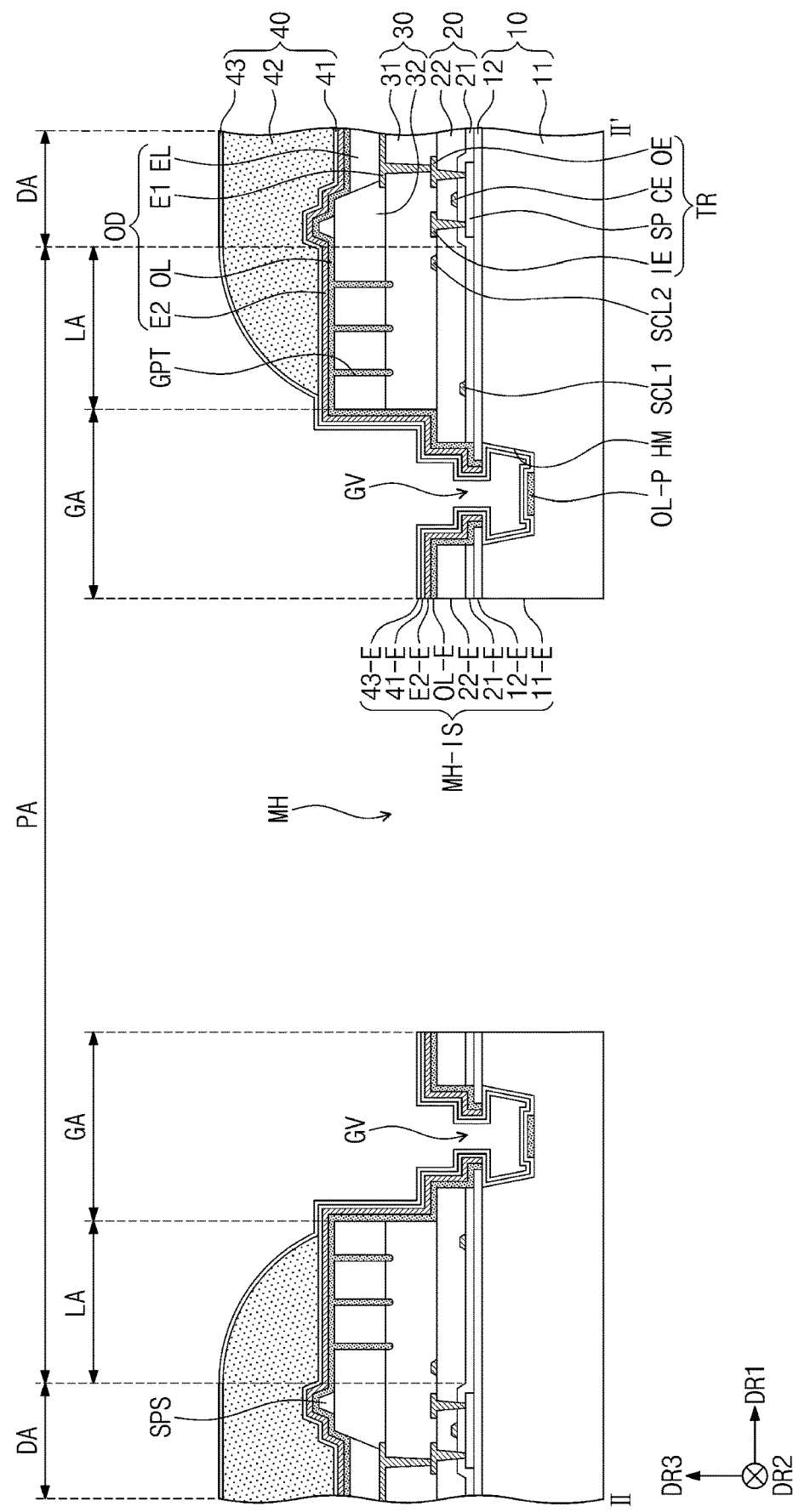

Thereafter, as illustrated in FIGS. 11E and 11F, after the mask MSK1 is removed, a light emitting element OD and an encapsulation layer 40 are formed, and then a module hole MH is formed to form the display panel 100. A detailed process thereof corresponds to those described with reference to FIGS. 10G to 10I, and thus, any repetitive detailed description will be omitted.

According to embodiments of the invention, the guide pattern GPT and the groove part HM may be simultaneously formed in the same process. Therefore, since the guide pattern GPT is formed without a separate additional process, the process may be simplified, and the process cost and process time may be reduced to be economical.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

INDUSTRIAL APPLICABILITY

In embodiments of the display panel and the method for manufacturing the same, the improvement in process reliability may improve the quality of the display panel, more facilitate the manufacturing method, and be effective in mass production. Therefore, embodiments of the invention for improving the process reliability of the display panel and the method for manufacturing the same have high industrial applicability.

The invention claimed is:

1. A display panel comprising:
a base substrate including a front surface and a rear surface, wherein a hole area, an active area surrounding the hole area, and a peripheral area adjacent to the active area are defined in the base substrate, and a through-hole defined through the base substrate from the front surface to the rear surface and a groove part surrounding the through-hole and recessed from the front surface are defined in the hole area;
a circuit layer comprising a first circuit insulating layer disposed on the base substrate, a second circuit insulating layer disposed on the first circuit insulating layer, and a thin film transistor disposed on the active area;
a display layer comprising a first display insulating layer disposed on the circuit layer, a second display insulating layer disposed on the first display insulating layer, and a light emitting element disposed on the active area and connected to the thin film transistor;
a guide pattern disposed on the circuit layer and disposed between the active area and the through-hole; and
an encapsulation layer which covers the light emitting element, wherein the encapsulation layer comprises a first inorganic layer disposed on the active area and the hole area, a second inorganic layer disposed on the first inorganic layer, and an organic layer disposed between the first inorganic layer and the second inorganic layer, wherein the organic layer covers at least a portion of the guide pattern in a plan view.

2. The display panel of claim 1, wherein the guide pattern is a recess pattern defined in the first display insulating layer or the second display insulating layer.

3. The display panel of claim 2, wherein the guide pattern passes through the second display insulating layer and is recessed from a top surface of the first display insulating layer on a cross-section.

4. The display panel of claim 2, wherein the guide pattern is defined in the second display insulating layer and spaced apart from the first display insulating layer.

5. The display panel of claim 2, wherein the guide pattern comprises:

a first guide pattern defined in the second display insulating layer and recessed from a top surface of the second display insulating layer; and
a second guide pattern defined in the first display insulating layer and recessed from a top surface of the first display insulating layer,
wherein the first guide pattern and the second guide pattern are spaced apart from each other when viewed on a plane.

6. The display panel of claim 1, wherein the guide pattern is a pattern disposed on the second circuit insulating layer and spaced apart from the first display insulating layer or the second display insulating layer when viewed on a plane.

7. The display panel of claim 6, wherein the guide pattern comprises the same material as the first display insulating layer or the second display insulating layer.

8. The display panel of claim 1, wherein the guide pattern comprises a plurality of island patterns spaced apart from each other when viewed on a plane.

9. The display panel of claim 8, wherein the island patterns are radially aligned from a center of the through-hole.

10. The display panel of claim 8, wherein the island patterns are randomly arranged.

11. The display panel of claim 1, wherein the guide pattern has a closed line shape surrounding the groove part when viewed on a plane.

12. The display panel of claim 11, wherein the closed line shape comprises at least one selected from a circle, an ellipse, and a polygonal shape.

13. The display panel of claim 1, wherein the groove part has an under-cut shape on a cross-section.

14. The display panel of claim 1, wherein the groove part comprises:
a first groove part adjacent to the through-hole; and
a second groove part disposed between the first groove part and the guide pattern to surround the first groove part,
wherein each of an inner surface of the first groove part and an inner surface of the second groove part is covered by the first inorganic layer.

15. The display panel of claim 14, wherein, when viewed on a plane, the organic layer overlaps the second groove part and is spaced apart from the first groove part.

16. The display panel of claim 15, further comprising:
a filling pattern disposed at the first groove part and spaced apart from the organic layer to be sealed by the first inorganic layer and the second inorganic layer,
wherein the filling pattern comprises a same material as the organic layer.

17. The display panel of claim 14, wherein, when viewed on a plane, the organic layer overlaps the first groove part and the second groove part.

18. The display panel of claim 1, further comprising:
a dam part disposed between the groove part and the through-hole to surround the groove part,
wherein the first inorganic layer covers the dam part.

19. An electronic apparatus comprising:
a display panel, in which a through-hole and a groove pattern adjacent to the through-hole are defined, wherein the groove pattern defines a predetermined recessed space; and
an electronic module which overlaps the through-hole when viewed on a plane,
wherein the display panel comprises:
a base substrate;

a circuit layer comprising a first circuit insulating layer disposed on the base substrate, a second circuit insulating layer disposed on the first circuit insulating layer, and a thin film transistor disposed on an active area;

a display layer comprising a first display insulating layer disposed on the circuit layer, a second display insulating layer disposed on the first display insulating layer, and a light emitting element disposed on the active area and connected to the thin film transistor;

a recess pattern disposed between the electronic module and the active area in a plan view and defined in the first display insulating layer or the second display insulating layer; and an encapsulation layer which covers the light emitting element, wherein the encapsulation layer comprises a first inorganic layer disposed on the active area and the recess pattern, a second inorganic layer disposed on the first inorganic layer, and an organic layer disposed between the first inorganic layer and the second inorganic layer, wherein at least a portion of the recess pattern is filled with the organic layer.

20. The electronic apparatus of claim 19, wherein the recess pattern is recessed from a top surface of the second display insulating layer.

21. The electronic apparatus of claim 20, wherein the recess pattern passes through the second display insulating layer and extends up to the first display insulating layer.

22. The electronic apparatus of claim 19, wherein the recess pattern is recessed from a top surface of the first display insulating layer and spaced apart from the second display insulating layer when viewed on the plane.

23. The electronic apparatus of claim 19, wherein
the recess pattern is provided in plurality, each of which has an island shape, and
the plurality of recess patterns are radially arranged from a center of the through-hole.

24. The electronic apparatus of claim 19, wherein
the recess pattern is provided in plurality, each of which has an island shape, and
the plurality of recess patterns are randomly arranged.

25. The electronic apparatus of claim 24, wherein the display panel further comprises a dam part disposed adjacent to the through-hole,
the groove pattern comprises:
a first groove pattern disposed between the through-hole and the dam part; and
a second groove pattern disposed between the dam part and the recess pattern to surround the first groove pattern, and
the second groove pattern is filled with the organic layer.

26. The electronic apparatus of claim 19, wherein the recess pattern has a closed line shape which surrounds the through-hole.

* * * * *